United States Patent
Wei et al.

(10) Patent No.: US 12,315,805 B2
(45) Date of Patent: May 27, 2025

(54) SELF-ALIGNED LATERAL CONTACTS

(71) Applicant: Intel Corporation, Santa Clara, CA (US)

(72) Inventors: Andy Chih-Hung Wei, Yamhill, OR (US); Yang-Chun Cheng, Portland, OR (US); Shaestagir Chowdhury, Portland, OR (US); Guillaume Bouche, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 792 days.

(21) Appl. No.: 17/443,714

(22) Filed: Jul. 27, 2021

(65) Prior Publication Data

US 2023/0032866 A1 Feb. 2, 2023

(51) Int. Cl.
*H01L 29/417* (2006.01)
*H01L 23/528* (2006.01)
*H10D 64/23* (2025.01)

(52) U.S. Cl.
CPC ....... *H01L 23/5286* (2013.01); *H10D 64/251* (2025.01)

(58) Field of Classification Search
None
See application file for complete search history.

(56) References Cited

U.S. PATENT DOCUMENTS

2020/0105603 A1* 4/2020 Chang .................. H01L 23/535
2020/0135634 A1* 4/2020 Chiang ............. H01L 21/76897

OTHER PUBLICATIONS

Prasad, et al., "Buried Power Rails and Back-side Power Grids: Arm® CPU Power Delivery Network Design Beyond 5nm," Conference Paper, Dec. 2019. Accessed from Internet at: https://www.researchgate.net/publication/339257846. 5 pages.
Clark, Peter, "Buried power rail takes transistors to 2nm," Jun. 2, 2020. Accessed from Internet at: https://www.eenewsanalog.com/news/buried-power-rail-2nm. 3 pages.
Prasad, Divya, "Can we Bury our Scaling Problems with Buried Power Rails and Back-side Power Delivery?" Arm Research—Research Articles, Mar. 5, 2020. Accessed from the Internet at: https://community.arm.com/developer/research/b/articles/posts/can-we-bury-our-scaling-problems-with-buried-power-rails-and-back-side-power-delivery. 6 pages.
Extended European Search Report received for EP application No. 22159400.5, dated Sep. 20, 2022. 5 pages.

* cited by examiner

*Primary Examiner* — Hrayr A Sayadian
(74) *Attorney, Agent, or Firm* — Finch & Maloney PLLC

(57) ABSTRACT

Techniques to form self-aligned lateral contacts. In an example, a first trench contact contacts a source or drain region of a transistor. A second trench contact includes non-contiguous first and second portions, each portion having a top surface that is co-planar with a top surface of the first trench contact as well as a top surface of the gate structure. A sidewall of the second trench contact is self-aligned to, and interfaces with, a sidewall of the first trench contact. A via extends from the first portion of the second trench contact to an underlying power rail. In some cases, the second portion of the second trench contact extends over a source or drain region of another transistor, without contacting that source or drain region. The fly-over portion of the second trench contact has a maximum height that is shorter than a maximum height of the first trench contact.

20 Claims, 19 Drawing Sheets

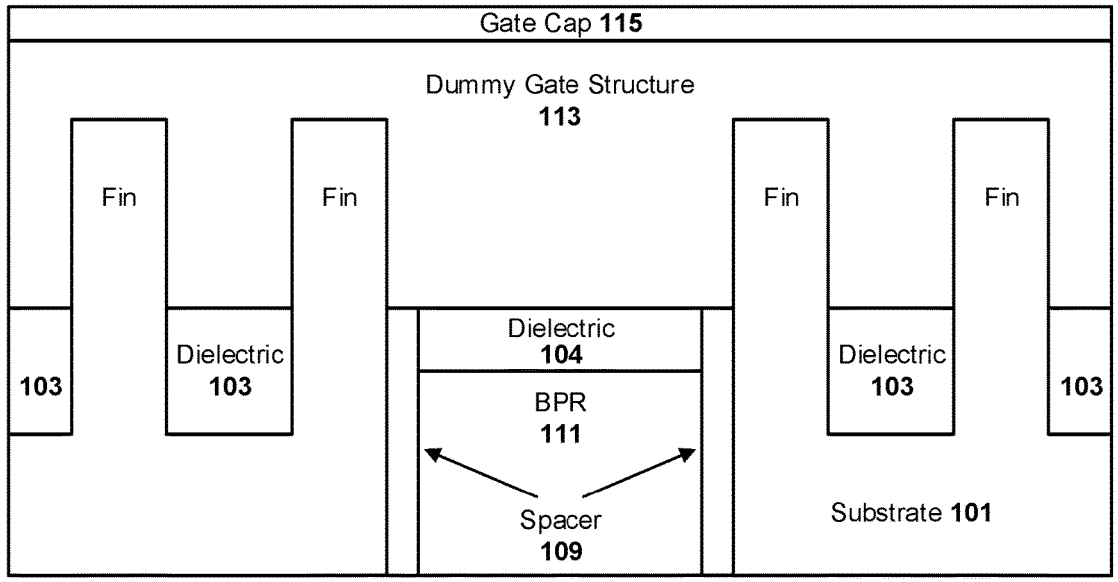
Fig. 7a
Fig. 7b
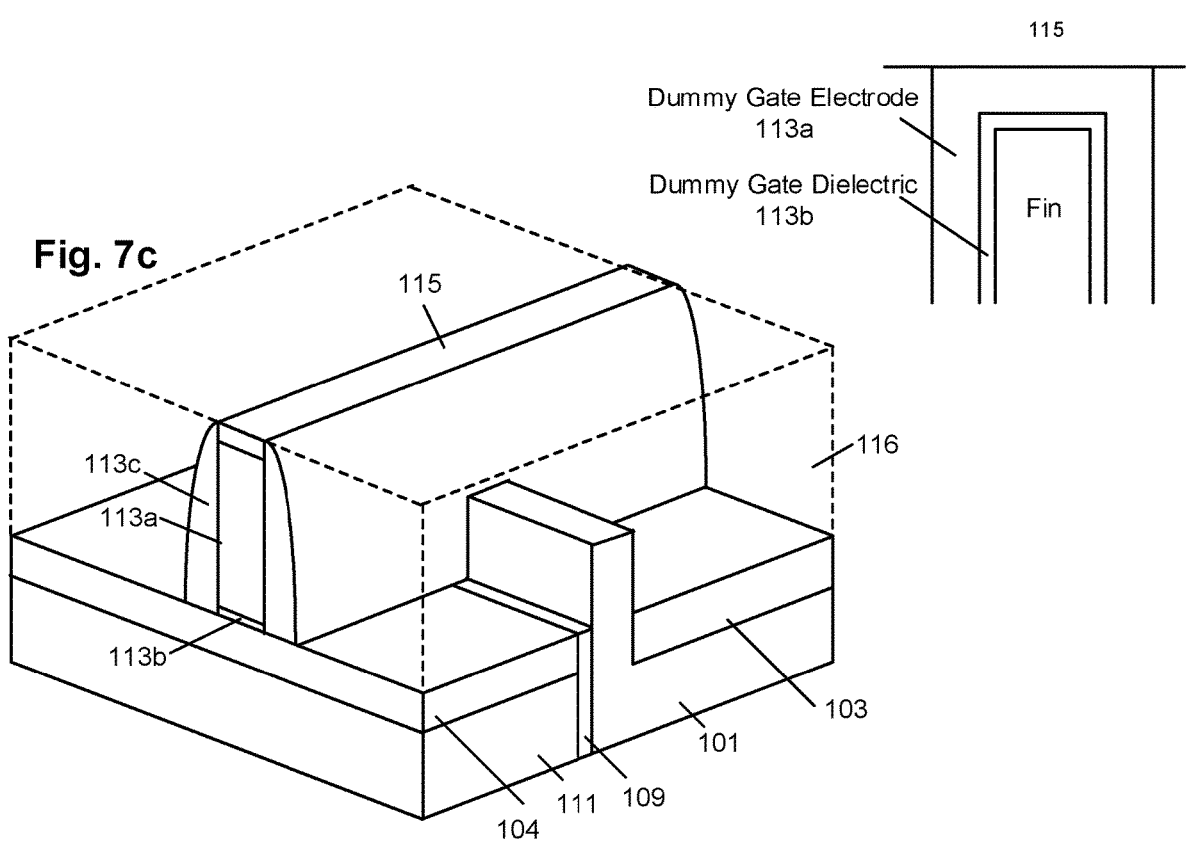
Fig. 7c

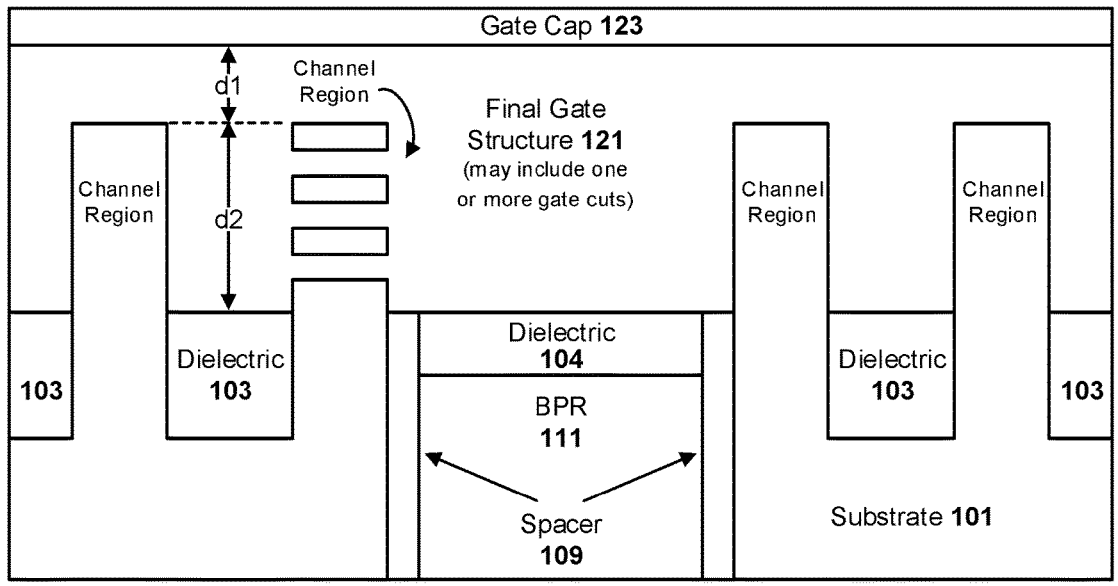
Example Gate Types:
- Double-gate
- Tri-gate
- Gate-all-around
- Any of above, with high-k gate dielectric
Fig. 9a
Fig. 9b
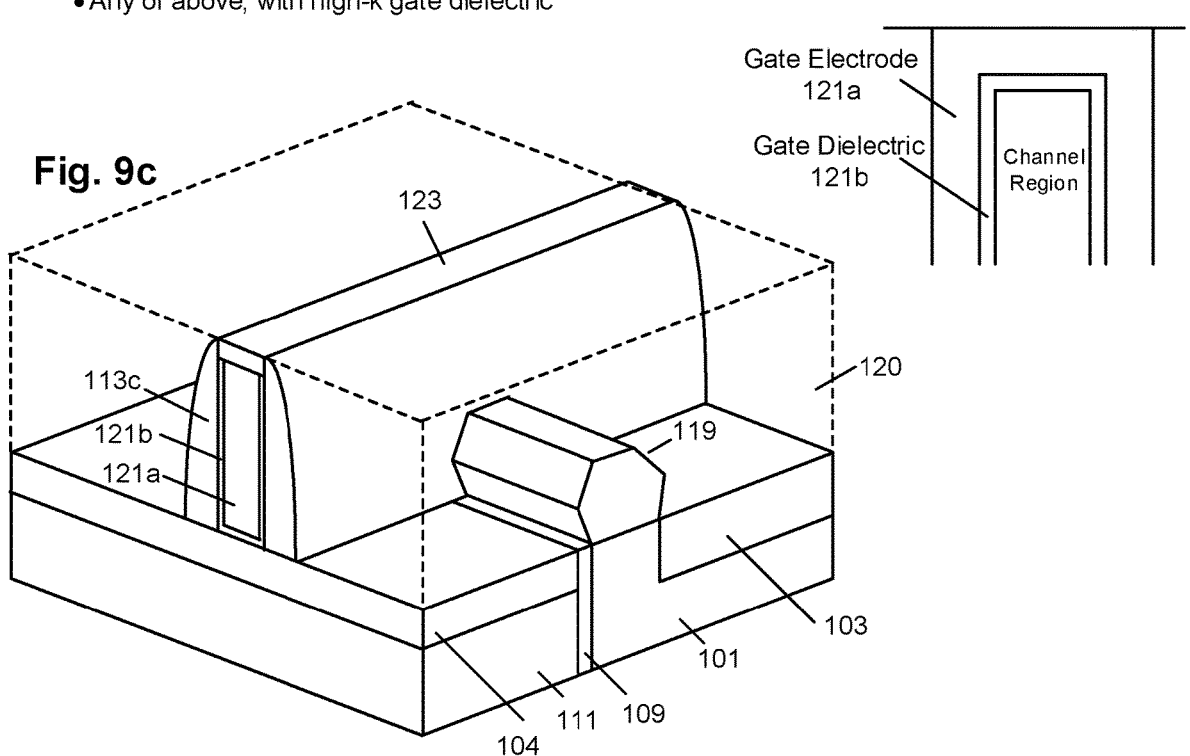
Fig. 9c

SELF-ALIGNED LATERAL CONTACTS

FIELD OF THE DISCLOSURE

The present disclosure relates to integrated circuits, and more particularly, to self-aligned lateral contacts.

BACKGROUND

As integrated circuits continue to scale downward in size, a number of challenges arise. For instance, reducing the size of memory and logic cells is becoming increasingly more difficult. One possible solution that can be used to allow further scaling of cell size includes buried or backside power rail technology, or more generally BPR technology. In some cases, BPR technology includes burying of conductors that deliver power (sometimes called power rails) to cells below the back end of line (BEOL) metal layers, usually in the same level as the device layer that includes semiconductor fins. In other cases, BPR technology includes forming such power rails on the back-side of the substrate underneath the device layer. Such BPR configurations free-up overhead to make more room for logic connections and enable further scaling of a standard logic cell (e.g., memory and logic cells). BPR configurations also allow for relatively larger power rails (e.g., thicker), which in turn exhibit lower resistance and power dissipation. However, there remain a number of non-trivial challenges with respect to BPR configurations.

BRIEF DESCRIPTION OF THE DRAWINGS

FIGS. 2-19b are cross-sectional or perspective views that collectively illustrate an example process for forming an integrated circuit configured with self-aligned lateral contacts, in accordance with an embodiment of the present disclosure.

DETAILED DESCRIPTION

Figure 1A:
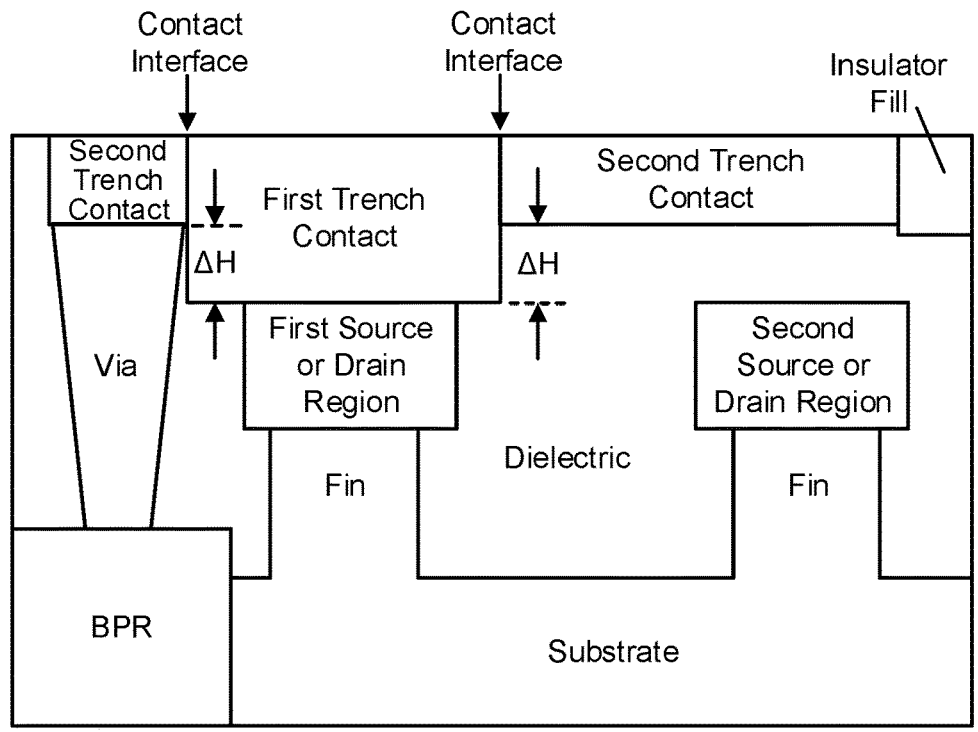
FIGS. 1a-1b are cross-sectional views that illustrate an example integrated circuit configured with self-aligned lateral contacts, in accordance with an embodiment of the present disclosure.

Techniques are provided herein to form self-aligned lateral contacts. Although the techniques can be used in any number of integrated circuit applications, they are particularly useful with respect to contacting schemes for logic and memory cells, such as those cells that use finFETs, gate-all-around transistors, or other transistor technologies, where contact from a given cell to an underlying conductive element (e.g., BPR) is desired. In an example, a first trench contact is on a source or drain region of a transistor. A second trench contact includes non-contiguous first and second portions, each portion having a top surface that is co-planar with a top surface of the first trench contact as well as a top surface of the gate structure. One or both of the first and second portions of the second trench contact has a maximum height that is shorter than a maximum height of the first trench contact. A sidewall of the first portion of the second trench contact is self-aligned to, and interfaces with, a sidewall of the first trench contact, so as to provide an electrical pathway (lateral contact) between the first and second trench contacts. In addition, a via extends from the first portion of the second trench contact to an underlying power rail or other conductor. Note the via is self-aligned to the first and second trench contacts. In some cases, the second portion of the second trench contact extends over a source or drain region of another transistor, without contacting that source or drain region. In such a case, the fly-over portion of the second trench contact has a maximum height that is shorter than a maximum height of the first trench contact. Numerous variations and embodiments will be apparent in light of this disclosure.

General Overview

As previously noted above, there remain a number of non-trivial challenges with respect to BPR configurations. In more detail, scaling of standard cells can be achieved by forming a power rail on a lower level, such as a buried power rail or a backside power rail. Such BPR configurations utilize additional contact layers to gain more connectivity, such as contacts for a source or drain region and the power rail, so as to allow for power to be provided from the power rail to the source or drain region. Such additional contact layers cause a taller stack, such as the example case where a first contact layer contacts a source/drain region, and a second contact layer above the first contact layer contacts the underlying BPR. In addition, overlay errors limit the size of these additional layers, and thus reduce the electrical performance (e.g., smaller conductors tend to be more resistive).

Thus, and in accordance with an embodiment of the present disclosure, techniques are provided herein to form self-aligned lateral contacts. The contacts are lateral in that they are adjacent to one another in the same plane, rather than being arranged in a stacked configuration where one contact is over the other. In an example, a first trench contact is self-aligned to the gate structure of a transistor, and contacts a source or drain region of the transistor. A second trench contact is also self-aligned to the gate structure and includes non-contiguous first and second portions, each portion having a top surface that is co-planar with a top surface of the first trench contact as well as a top surface of the gate structure. One or both of the first and second portions of the second trench contact has a maximum height that is shorter than a maximum height of the first trench contact. A sidewall of the first portion of the second trench contact is self-aligned to, and interfaces with or otherwise contacts, a sidewall of the first trench contact. To this end, the first portion of the second trench contact is electrically connected (shorted) to the first trench contact, so as to provide a lateral contact and conductive pathway. In addition, a via extends from the first portion of the second trench contact to connect with an underlying power rail. The power rail can be, for instance, a buried power rail or a backside power rail. Note the via is self-aligned to the first and second trench contacts. In some cases, the second portion of the second trench contact extends over a source or drain region of another transistor, without contacting that source or drain region. In such an example case, the second portion of the second trench contact has a maximum height that is shorter than a maximum height of the first trench contact.

Note that the first and second trench contacts may include the same conductive material, or different conductive materials. Example conductive materials include, for instance, ruthenium, tungsten, molybdenum, cobalt, and alloys thereof. Further note that either or both of the first and second trench contacts may include a conductive liner. Example liner materials include, for instance, titanium silicide, titanium nitride, tungsten carbo-nitride (WCN), physical vapor deposited (PVD) or atomic layer deposited (ALD) tungsten, and tantalum nitride. Any number of other conductive materials and liner materials can be used, and the present disclosure is not intended to be limited to any particular ones. In any such cases, a detectable interface will be present between the first and second trench contacts. For instance, in one example case where the first and second trench contacts are the same conductive material (e.g., ruthenium) and neither has a liner, there will be a detectable grain boundary or set of grain boundaries between the two separately deposited conductive materials. In another example case where the first trench and/or the second trench contact includes a thin liner (e.g., 2-10 angstroms titanium nitride or titanium silicide, or both), the liner material(s) will be detectable between the two trench contacts. The height difference between the first and second trench contacts can also vary from one embodiment to the next, but in some cases is in the range of about 4 to 15 nanometers (nm), such as about 8 to 11 nm.

The techniques can be used with any type of planar and non-planar transistors, including finFETs (sometimes called double-gate transistors, or tri-gate transistors), nanowire and nanoribbon transistors (sometimes called gate-all-around transistors), and thin film transistors, to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a remove metal gate, or RMG, process). Any number of semiconductor materials can be used in forming the transistors to which power is being supplied by a buried or backside power rail, such as group IV materials (e.g., silicon, germanium, silicon germanium) or group III-V materials (e.g., gallium arsenide, indium gallium arsenide).

A number of benefits of such self-aligned, lateral multi-level contacts will be appreciated in light of this disclosure. For instance, the self-alignment scheme allows for a maximum critical dimension of each of the first trench contact, the second trench contact, and the via, to reduce electrical resistance attributable to those features. According to an embodiment, a cross-section parallel to the gate structure and in the center of the source or drain regions, will show a multi-height contact scheme with a full height trench contact and a partial height trench or otherwise less tall trench contact. In some such cases, a portion of the shorter trench contact may also fly-over an uncontacted source or drain region. In addition, according to an embodiment, an interface between laterally neighboring tall and shorter contact will be detectable (e.g., cross-sectional imaging by way of scanning electron microscopy or SEM, transmission electron microscopy or TEM, or other suitable inspection tool).

Architecture

FIG. 1a is a cross-sectional view that illustrates an example integrated circuit configured with self-aligned lateral contacts, in accordance with an embodiment of the present disclosure. The cross-section is taken through the source or drain regions of neighboring transistors, and parallel to the gate structure (not visible in this cross-section, as it is behind the depicted portion of the integrated circuit). The transistors in this example are non-planar metal oxide semiconductor (MOS) transistors, such as tri-gate or gate-all-around transistors, although other transistor topologies and types can also benefit from the techniques provided herein, as will be appreciated (e.g., planar transistors, thin film transistors, or any other transistors to which contact can be made).

As can be seen, the integrated circuit includes a substrate having first and second fins extending therefrom. Any number of fins may be included, but two are used here as an example. As can further be seen, first and second fins are separate by dielectric fill, with each fin having a source or drain region deposited or otherwise formed thereon. A first trench contact is on the left source or drain region, and includes first and second sidewalls that extend between top and bottom surfaces of the first trench contact. A second trench contact includes non-contiguous first and second portions to either side of the first trench contact, each portion having a top surface that is co-planar with the top surface of the first trench contact as well as the top surface of the gate structure. The right sidewall of the first (left) portion of the second trench contact is in contact with the left sidewall of the first trench contact so as to provide an interface therebetween. Likewise, in this example, the left sidewall of the second (right) portion of the second trench contact is in contact with the right sidewall of the first trench contact so as to provide an interface therebetween. As can be further seen, a via extends from the first portion of the second trench contact to an underlying conductor, which in this example case is a buried power rail (BPR).

Note the height difference ($\Delta H$) between the first and second trench contacts. In some such example cases, $\Delta H$ is in the range of 4 to 15 nm (e.g., 8 to 11 nm). Further note how the second portion of the second trench contact extends over the right source or drain region, with no contact to that source or drain region. This is referred to herein as a fly-over portion. Further note that the right sidewall of the second portion of the second trench contact is in contact with an insulator material, the insulator material having a top surface that is co-planar with the top surfaces of the first trench contact, second trench contact, and gate structure. Further note that the insulator material has a maximum height that extends from the top surface of the insulator material to a bottom surface of the insulator material, the maximum height of the insulator material being shorter than the maximum height of the first trench contact. In some example cases, the maximum height of the insulator material is equal to or taller than the maximum height of the second trench contact and shorter than the maximum height of the first trench contact. For instance, in one such example case, the maximum height of the first trench contact is about 22 to 26 nm, the maximum height of the second trench contact is about 11 to 15 nm, and the maximum height of the insulator material is about 14 to 18 nm. Here, $\Delta H$ is in the range of about 7 to 15 nm.

Each of the first and second trench contacts can include any number of conductive materials, with some example such materials including ruthenium, tungsten, cobalt, molybdenum, and alloys thereof. In some cases, the first and second trench contacts may include a relatively thin liner or barrier, such as titanium nitride, titanium silicide, tungsten carbo-nitride (WCN), PVD or ALD tungsten, or tantalum nitride. The liner or barrier may be, for instance, 2 to 10 angstroms (e.g., 5 angstroms) thick. Still other embodiments may include multi-layer trench contacts with or without a liner or barrier, such as a first layer of ruthenium on the source or drain region and a second layer of cobalt on the ruthenium layer. Any number of trench contact configurations can be used. The interface between the first and second trench contacts can vary, depending on the make-up of the first and second trench contacts. For instance, in one example case where both the first and second trench contacts include the same material (e.g., ruthenium, with no liners or barriers), the interface therebetween may include a detectable grain boundary or set of grain boundaries or seam. In another example case where the first and/or second trench contacts include a liner, the interface therebetween may include detectable liner material(s). Such a grain boundary or set of boundaries, seam, or liner material can be detected, for instance, via cross-sectional TEM imaging.

The via can be the same material as the first and/or second trench contacts, and similarly may or may not include a liner or barrier. In one example embodiment, the via and the second trench contact are formed by the same deposition process, such that the first portion of the second trench contact and the via are one monolithic structure and there is effectively no discernible seam or interface between that first portion of the second trench contact and the via. Note, however, that the first portion of the second trench contact would still have a discernible height, by not counting the height of the via. In this sense, even though the second trench contact and the via are one monolithic conductive structure, the portion of that structure attributable to the first portion of the second trench contact can still be thought of as having the same maximum height as the second portion of the second trench contact, by not counting the height of the via.

The BPR can be the same material as the via, first trench contact, and/or second trench contact, and similarly may or may not include a liner or barrier. In one example embodiment, the BPR includes an insulative barrier or spacer, so as to prevent the BPR from contacting any neighboring fins. In some such embodiments, an oxide or nitride spacer is used, such as silicon dioxide or silicon nitride. The insulative spacer can be relatively thin, such as 2 to 6 nm, or thinner so long as it electrically isolates the BPR from the neighboring fins, for the given application. In other example embodiments, the BPR may be a backside power rail that is accessible on the other (bottom) side of the substrate.

The substrate can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, the substrate can be a semiconductor-on-insulator substrate having a desired semiconductor layer over a buried insulator layer (e.g., silicon over silicon dioxide). Alternatively, the substrate can be a multilayer substrate or superlattice suitable for forming nanowires or nanoribbons (e.g., alternating layers of silicon and SiGe, or alternating layers indium gallium arsenide and indium phosphide). Any number of substrates can be used.

Any number of fins may be included, but two are used here as an example. The fins can be, for example, native to the substrate (formed from the substrate itself), such as silicon fins etched from a bulk silicon substrate. Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around process can then be carried out. Again, the alternating layers can be blanket deposited and then etched into fins, or deposited into fin-shaped trenches. Other embodiments may use planar transistor architecture, such that there are no fins, nanowires or ribbons.

As can be further seen in this example case, the source or drain regions are epitaxial source or drain regions that are provided on the fins in an etch-and-replace process. In other embodiments one or both of the source or drain regions could be, for example, implantation-doped native portions of the fins or substrate. Any semiconductor materials suitable for source and drain regions can be used (e.g., group IV and group III-V semiconductor materials). The source and drain regions may include multiple layers such as liners and capping layers to improve contact resistance. In any such cases, the composition and doping of source or drain regions may be the same or different, depending on the polarity of the transistors. In an example, for instance, one transistor is a p-type MOS (PMOS) transistor, and the other transistor is an n-type MOS (NMOS) transistor. Any number of source and drain configurations and materials can be used.

The dielectric can be any suitable dielectric material, such as silicon dioxide or aluminum oxide. The insulator fill can likewise be any number of suitable insulator materials, such as silicon nitride or silicon oxynitride, or silicon oxycarbonitride. As will be explained in turn, the insulator fill and dielectric materials can be selected to provide a desired etch selectivity with respect to other materials also exposed to the etchant being used during a given removal process.

Figure 1B:
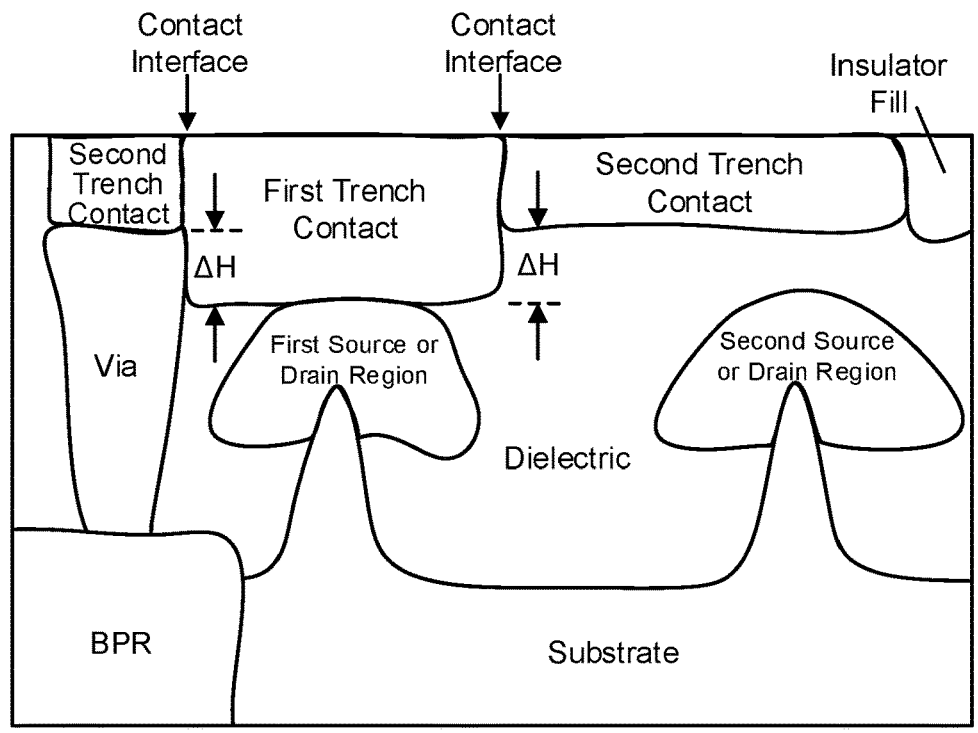

FIG. 1b illustrates an integrated circuit similar to that depicted in FIG. 1a, except that the various features are drawn to reflect real-world process conditions. For instance, while FIG. 1a generally indicates the various features using straight lines, right angles, and smooth surfaces, an actual integrated circuit structure configured in accordance with an embodiment of the present disclosure may have less than perfect straight lines and right angles, and some features may have surface topography or otherwise be non-smooth, given real-world limitations of fabrication processes such as etching and depositing. As can be seen in FIG. 1b, the top, bottom and side surfaces are somewhat wavy or irregular rather than being perfectly flat; likewise, the fins and via are tapered rather than rectangular, and the source or drain regions are more blob-like rather than perfectly faceted. Other such real-world features or imperfections may manifest as well, and the present disclosure is not intended to be limited to any particular shapes or level of perfection. As will be further appreciated, the figures are not necessarily drawn to scale or intended to limit the described embodiments to the specific configurations shown.

Fabrication Methodology

FIGS. 2-19b are cross-sectional or perspective views that collectively illustrate an example process for forming an integrated circuit configured with self-aligned lateral contacts, in accordance with an embodiment of the present disclosure. Each figure shows an example structure that results from the process flow up to that point in time, so the depicted structure evolves as the process flow continues, culminating in the structure shown in FIGS. 19a-b. Such a structure may be part of an overall integrated circuit (e.g., such as a processor or memory chip) that includes, for example, digital logic cells and/or memory cells and analog mixed signal circuitry. Thus, illustrated integrated circuit structure may be part of a larger integrated circuit that includes other integrated circuitry not depicted. Example materials and process parameters are given, but the present disclosure is not intended to be limited to any specific such materials or parameters, as will be appreciated.

Figure 2:
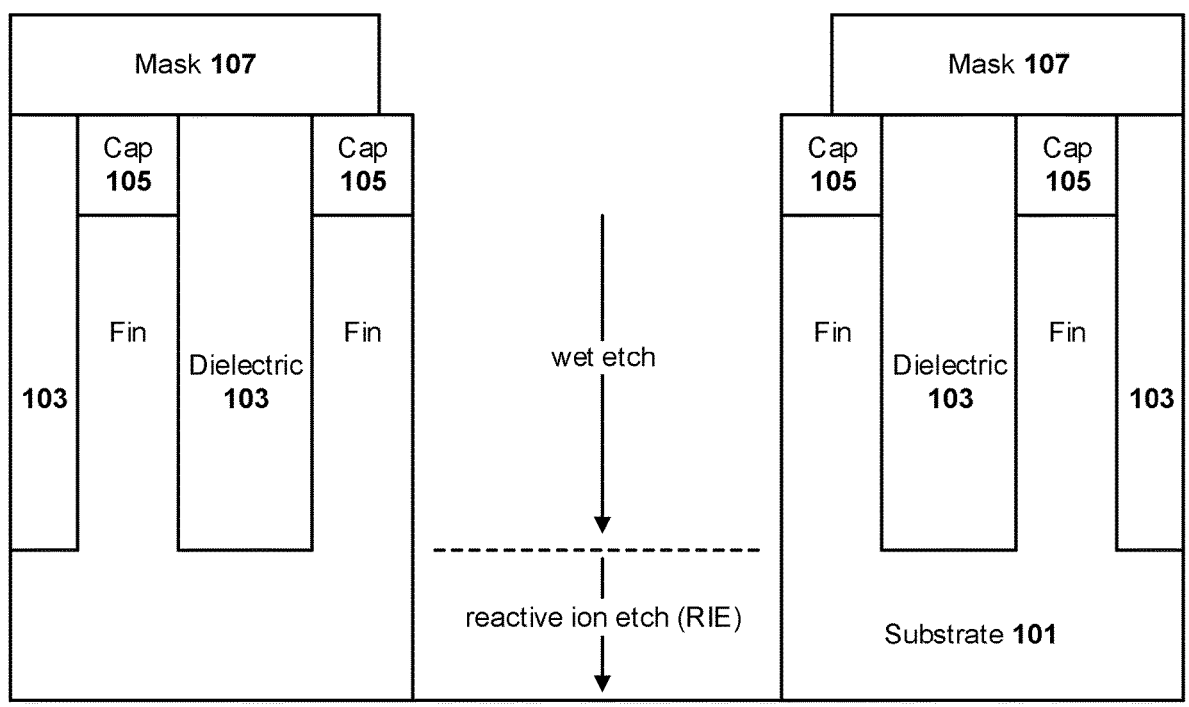

FIG. 2 is cross-sectional view taken through and perpendicular to a set of semiconductor fins extending from a substrate 101, according to an embodiment of the present disclosure. The previous relevant discussion with respect to example configurations and materials for the substrate 101 and fins as well as the dielectric 103 is equally applicable here. So, the fins can be native to the substrate, or non-native to the substrate, or multi-layer fins suitable for forming nanowires or nanoribbons. Likewise, the fins can be, for instance, alternating with respect to transistor polarity. For instance, the two fins on the left can include a PMOS material fin (e.g., SiGe fin) and an NMOS material fin (e.g., silicon fin) for a first logic or memory cell, and the two fins on the right can include a PMOS material fin and an NMOS material fin for a second logic or memory cell. Numerous other configurations can be used, including fins included in integrated circuit sections other than memory or logic sections, such as analog mixed signal sections, input/output sections, radio frequency or transducer sections. Further recall that the transistors may be planar transistors, rather than non-planar.

In this example case, a protective layer or cap 105 is left on the top of each fin, so as to provide the fins a degree of protection during subsequent processing. In cases where the dielectric 103 is an oxide (e.g., silicon dioxide), the cap 105 can be, for instance, a nitride, oxynitride, a carbide, or an oxycarbonitride so as to provide etch selectivity with respect to the dielectric 103. As can be further seen, a lithography mask 107 is patterned to provide an opening for a trench to be etched for where a buried power rail will be deposited. The lithography mask 107 can be any suitable mask such as, for instance, photoresist or one or more layers (e.g., carbon hard mask or an anti-reflective coating film or a silicon oxynitride) that provide the desired etch selectivity to allow for forming the trench. Note how the mask 107 need not be perfectly aligned to the edge of the caps 105, given like etch selectivities of 105 and 107 with respect to the trench etch scheme.

Any number of wet and/or dry etching techniques can be used to etch the trench where the buried power rail will be deposited. In this example case, the etch scheme includes a wet etch that is selective to cap 105 and mask 107, to remove any fins (e.g., silicon) and dielectric 103 (e.g., silicon dioxide) exposed by the opening in mask 107, or just the dielectric 103 in cases where select fin(s) are removed in an earlier operation. Once the base of the substrate 101 is reached, the example etch scheme includes a reactive ion etch (RIE) to etch the remainder of the trench within the substrate 101. While dimensions can vary from one example embodiment to the next, in one example case, the total height from bottom of substrate 101 to top of cap 105 can be 250 nm or more, with the portion etched by RIE being in the range of 50 to 100 nm, and with the fins thereabove having a height in the range of 50 to 200 nm (e.g., 60 to 130 nm), and the cap 105 having a height in the range of 5 to 25 nm. The width of the fins can be, for example, in the range of 5 to 200 nm. The pitch between neighboring fins can be, for example, in the range of 25 to 600 nm. In some such example embodiments, a width-to-height aspect ratio of the fins is in the range of about 1:5 to 1:20, such as the specific example case where the fins are about 25 nm wide at their mid-point, and about 200 nm tall, so as to provide a 1:8 width-to-height aspect ratio.

Figure 3:
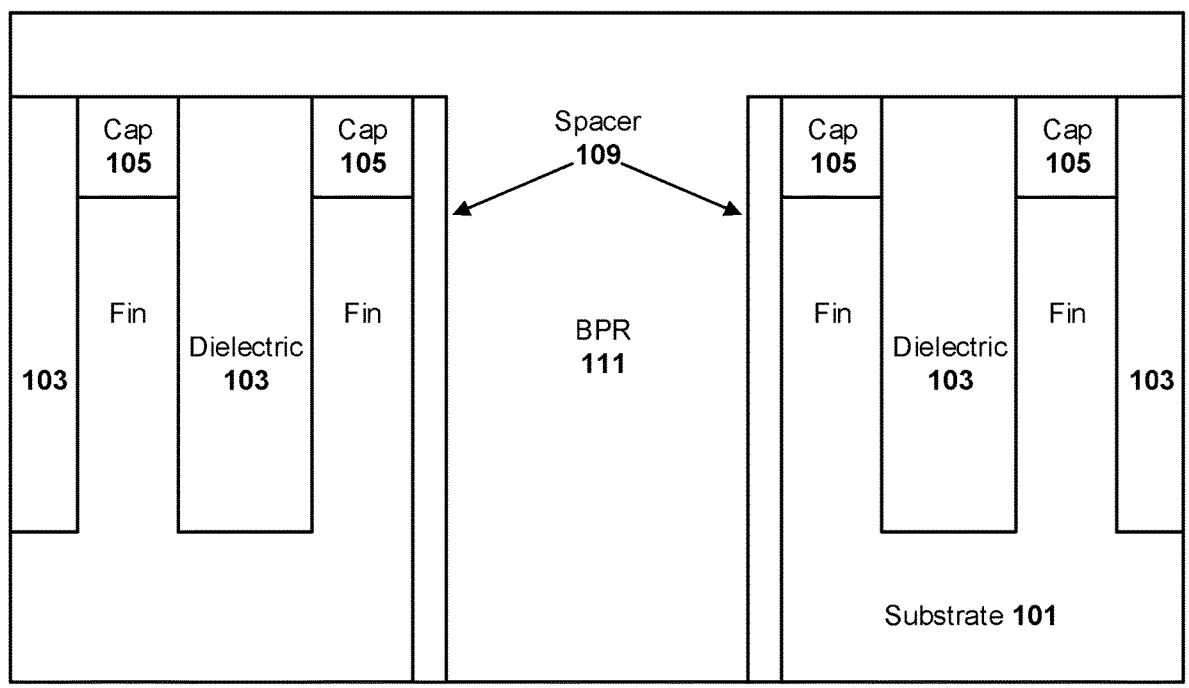
Figure 4:
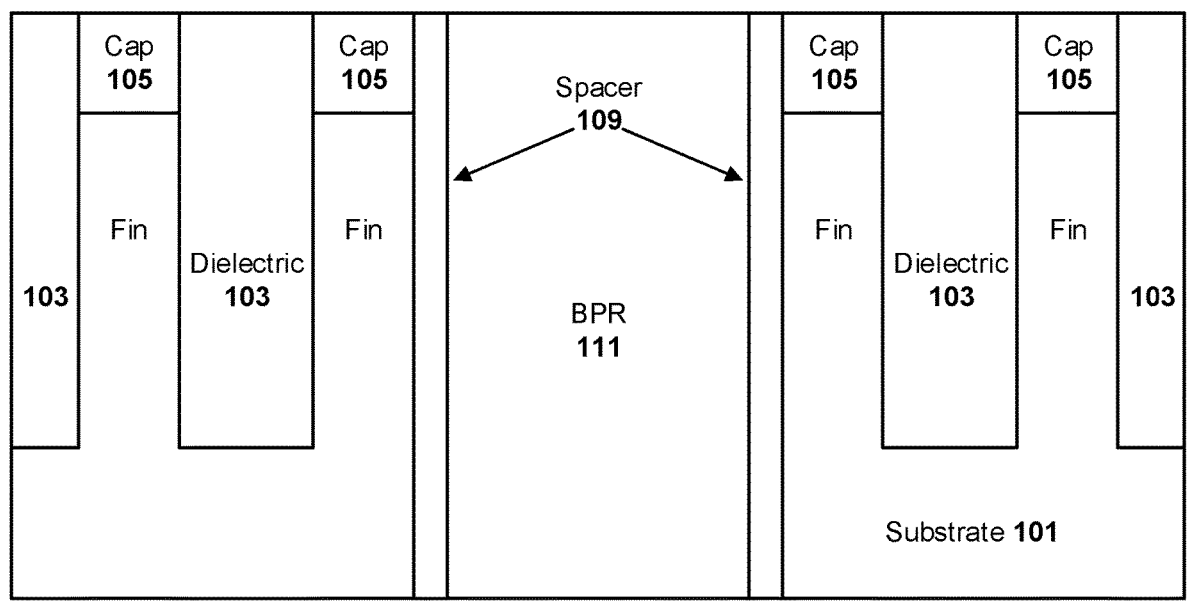

FIG. 3 is the cross-sectional view of the structure depicted in FIG. 2, after removal of mask 107 and formation of spacer 109 and deposition of BPR 111, according to an embodiment of the present disclosure. Mask 107 can be removed by any suitable means, such as selective wet chemical etch. Once the structure is free of mask 107, spacer 109 can be formed. In one example case, spacer 109 is conformally deposited over the entire structure using atomic layer deposition (ALD) or chemical vapor deposition (CVD). The excess spacer 109 material in the horizontal locations is then removed using a directional etch which in some embodiments is selective to the dielectric 103 and cap 105, but it need not be. The resulting spacer can have a thickness, for instance, in the range of 0.05 to 5 nm. In a more general sense, spacer 109 can have any thickness suitable to insulate the BPR 111 material from touching the neighboring fins defining the sidewalls of the trench. In some example embodiments, the spacer 109 can be implemented with, for instance, an oxide, nitride, or carbide, such as silicon oxide or silicon nitride. In one such embodiment, where dielectric 103 is an oxide and cap 105 is silicon nitride, spacer 109 is implemented with a dense silicon oxide, so as to provide a degree of etch selectivity with respect to dielectric 103 and cap 105. Once spacer 109 is formed, the BPR 111 material can be deposited by, for example, electroplating, CVD, or ALD (for selective bottom-up deposition). BPR 111 can be any number of conductive materials, such as tungsten, molybdenum, ruthenium, cobalt, copper, aluminum, silver, or alloys thereof. FIG. 4 is the cross-sectional view of the structure depicted in FIG. 3, after removal of excess BPR 111 material (e.g., by way of a planarization/polishing technique such as CMP), according to an embodiment. Further note BPR 111 can run parallel to the fins for any desired distance.

Figure 5:
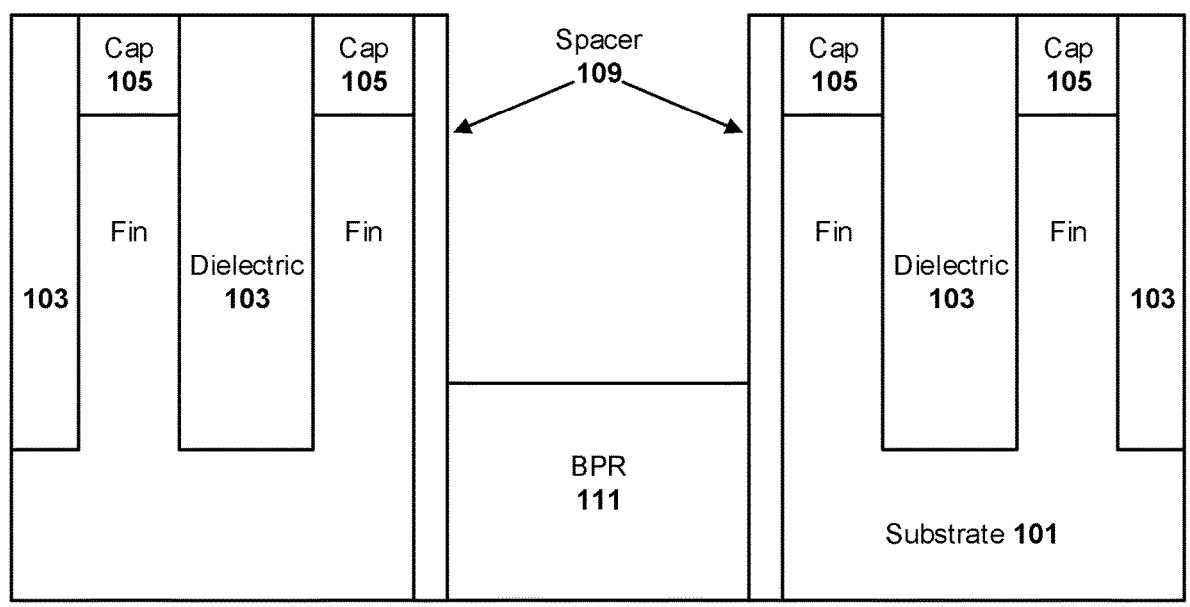

FIG. 5 is the cross-sectional view of the structure depicted in FIG. 4, after recessing of BPR 111 material, according to an embodiment. In some example cases, this recessing is accomplished using an isotropic metal etch process selective to dielectric 103, cap 105, and spacer 109. The depth of the recess will depend on the desired height of the BPR, but in some example cases is in the range of 20 to 150 nm (e.g., 50 to 80 nm). The height of the BPR can vary as well, but in some example cases, is in the range of about 20 to 500 nm (e.g., 30 to 90 nm).

Figure 6:
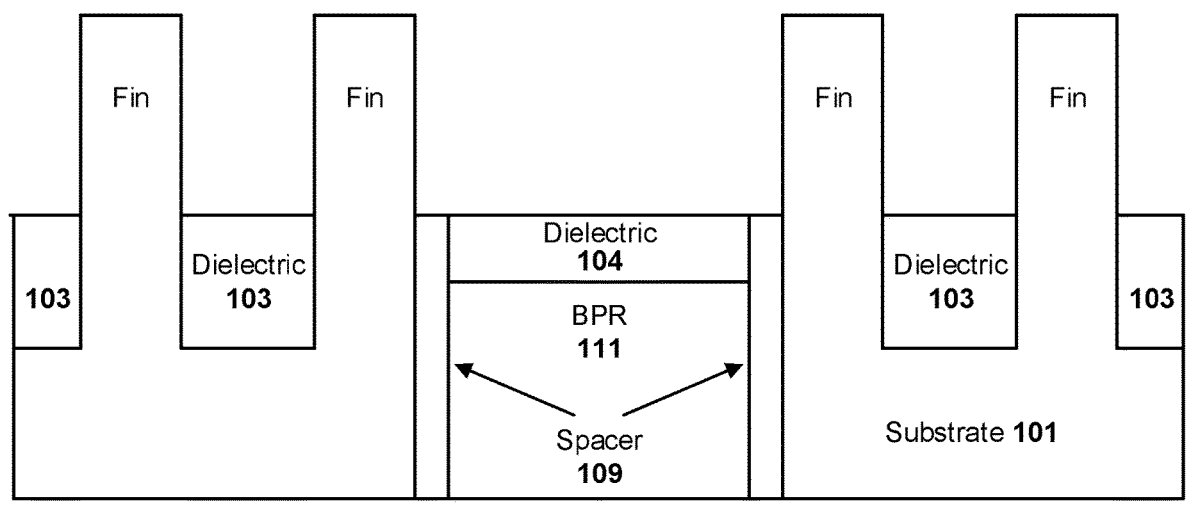

FIG. 6 is the cross-sectional view of the structure depicted in FIG. 5, after a trench refill with dielectric and CMP process to remove excess dielectric as well as cap 105 to expose the fin tops, followed by a dielectric recess to expose the top portions (channel regions) of the fins, according to an embodiment. In some example cases, the trench refill includes deposition of dielectric 104 (which may be the same as dielectric 103, such as silicon dioxide). A CMP process can then be used to remove the excess dielectric 104 and to expose the fin tops. Then a recess etch that is selective to the exposed semiconductor fin material(s) is performed to recess the dielectric 104 and possibly dielectric 103, depending on the depth of the recess. Note that spacer 109 is also recessed in this process, in this example. In some such cases, the fins are silicon, and dielectric 103 and 104 along with spacer 109 are an oxide (e.g., silicon dioxide), so as to allow for a singular etch selectivity with respect to the silicon fins.

In some example cases, the remaining thickness of dielectric 104 remaining above BPR 111 is in the range of about 5 to 25 nm (e.g., 15 nm).

FIG. 7a is the cross-sectional view of the structure depicted in FIG. 6, after the dummy gate structure 113 and gate cap 115 have been formed, according to an embodiment. As can be seen, the cross-section is taken parallel to and through the dummy gate structure 113, and perpendicular to the fins. The dummy gate structure 113 can be any standard or proprietary gate structure. According to an embodiment, the dummy gate structure 113 is formed by a blanket deposition of the dummy gate material(s) followed by a masking and etch to remove the excess gate material(s), such that the dummy gate structure 113 only remains across the channel regions of the fins. The configuration of the dummy gate structure 113 can vary from one embodiment to the next, but in some embodiments includes amorphous silicon, and in still other embodiments such as best shown in FIGS. 7b-c includes a dummy gate electrode 113a (e.g., polysilicon), a dummy gate dielectric 113b (e.g., an oxide of the fin material, such as silicon dioxide in the case of silicon fins), and a gate spacer 113c (e.g., silicon oxycarbonitride, or other material that is etch selective with respect to other the dummy gate material or materials). Once the dummy gate structure 113 is formed, dielectric 116 is deposited (e.g., CVD) and planarized down to the gate cap 115 using a CMP process, as best shown in FIG. 7c. Gate cap 115 protects the dummy gate structure during subsequent source and drain processing, and can be any number of materials, such as silicon nitride. The dimensions of the dummy gate structure 113 can vary from one embodiment to the next, as will be appreciated. In some example cases, the distance from the top of a given fin to the top of the dummy gate structure 113 is in the range of 50 to 100 nm (e.g., 75 nm), and the distance from the top of a given fin to the bottom of the dummy gate structure 113 is in the range of 25 to 100 nm (e.g., 35 to 75 nm). The width of the dummy gate structure 113 will also vary, depending on factors such as desired channel length and/or fin thickness (for non-planar transistors), but in some cases is in the range of 20 to 100 nm. The thickness of gate cap 115 may be, for example, in the range of 20 to 100 nm (e.g., 30 to 75 nm). If present, a dummy gate dielectric 113b may have a thickness in the range of, for example, one or more monolayers to 10 nm. The gate spacers 113c, when present, can be conformally deposited and have any desired thickness, such as in the range of 5 to 40 nm. As will be explained in turn, the gate spacer 113c may be conformally deposited in a blanket fashion so as to also cover the exposed sidewalls of fin portions where the source and drain regions will be formed, and thus can subsequently be used as a guide in an epitaxial source and drain formation process.

Figure 8A:
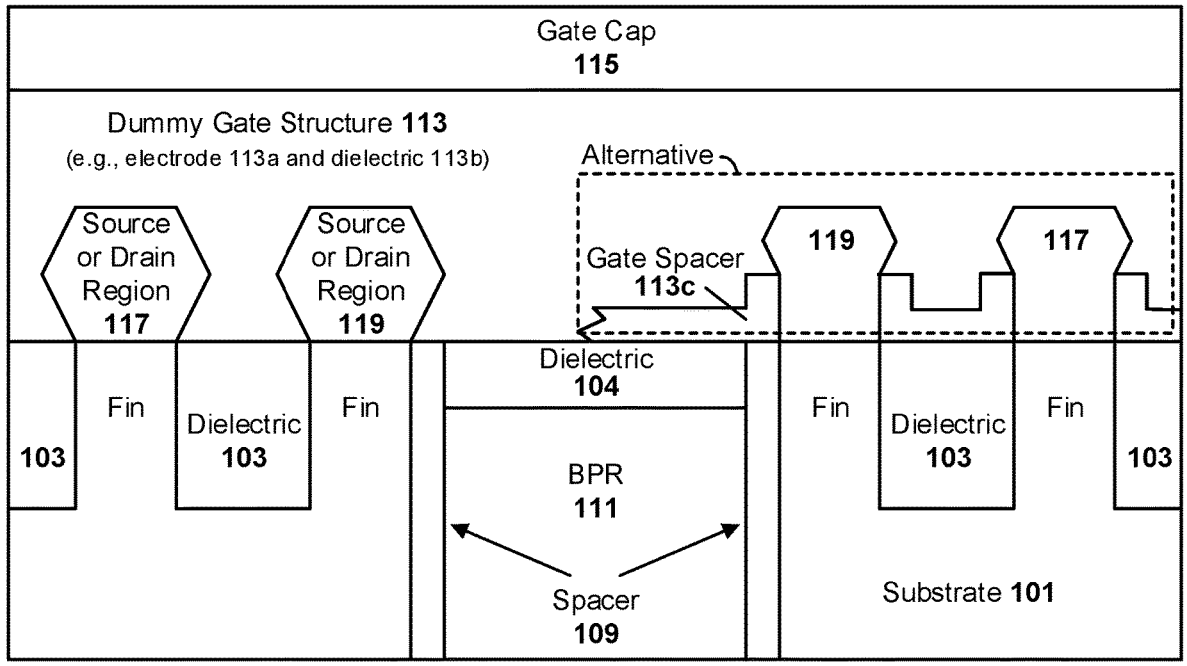
Figure 8B:
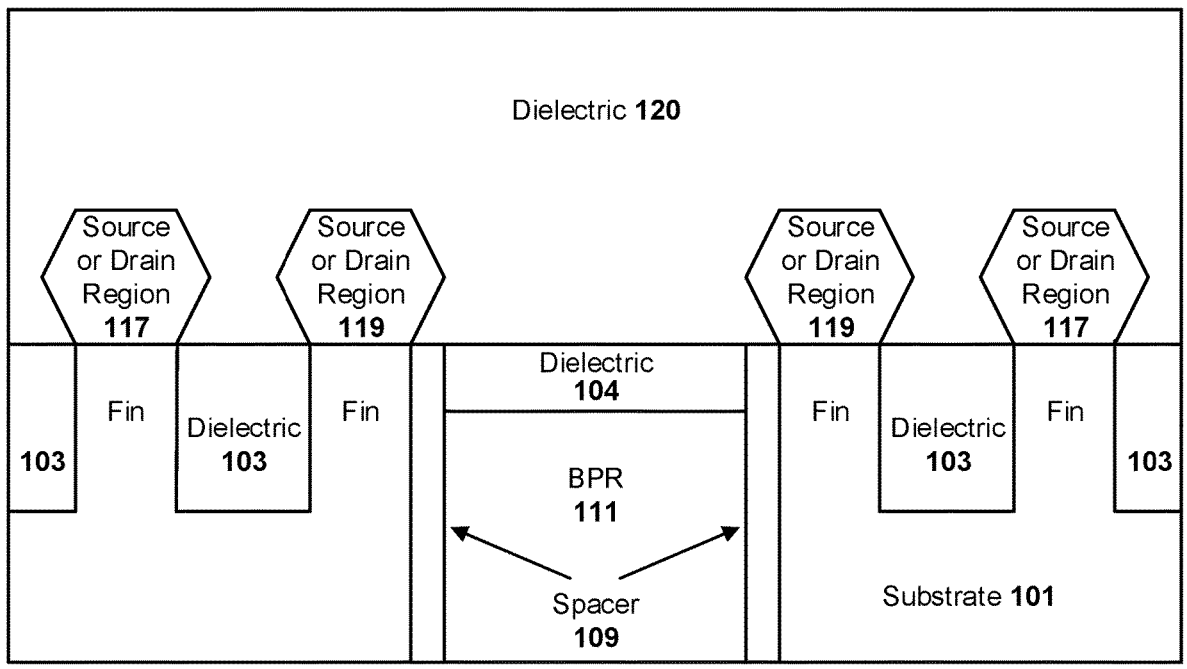

FIG. 8a is the cross-sectional view of the structure depicted in FIGS. 7a-c, after epitaxial source or drain regions 117 and 119 have been formed, according to an embodiment. As can be seen, the cross-section is taken parallel to the dummy gate structure 113 and through the source or drain regions. Note the dielectric material over the fins in the source or drain regions is not shown in FIG. 8a, so the dummy gate structure 113 can be seen in the background of the cross-section. The source or drain regions 117 and 119 can be formed using any standard or proprietary source/drain processing method. In this example case, source or drain regions 117 and 119 are formed by an etch and replace process, where original fin material is etched away and replaced via epitaxial deposition of the desired source/drain material. As can be seen on the right side of the structure, gate spacer 113c can be used as a guide during the epitaxial growth of the source or drain regions 117 and 119, which constrains the source or drain regions 117 and 119 (note the smaller degree of faceting on the right side source or drain regions 117 and 119, compared to the left side source or drain regions 117 and 119). In some example embodiments, source or drain regions 117 are NMOS source or drain regions (e.g., epitaxial silicon), and source or drain regions 119 are PMOS source or drain regions (e.g., epitaxial SiGe), so as to provide complementary MOS (CMOS) logic or memory cells. In such cases, note that the source/drain forming process may be bifurcated to first form one of the PMOS or NMOS source/drain regions while the other regions are masked, and then form the other one of the PMOS or NMOS source/drain regions while the first formed regions are masked. FIG. 8b shows the same structure as in FIG. 8a, but with the dielectric 120 in place over the source or drain regions 117 and 119, so the dummy gate structure 113 is now hidden. Dielectric 120 can be, for example, the same dielectric material as used for dielectric 103 and 104 (e.g., silicon dioxide), but need not be.

FIG. 9a is the cross-sectional view of the structure depicted in FIGS. 8a-c, after the final gate structure 121 and gate cap 123 have been formed, according to an embodiment. As can be seen, the cross-section is taken parallel to and through the final gate structure 121, and perpendicular to the fins. The final gate structure 121 can be any standard or proprietary gate structure, and may include any number of gate cuts. According to an embodiment, the final gate structure 121 is formed by a masking, etch and deposition process (sometimes referred to as a gate-last or remove metal gate RMG process), which includes removing gate cap 115 and the underlying dummy gate structure 113 except for the gate spacer 113c, followed by any desired channel processing on the exposed channel region (e.g., channel shaping, cladding, or liberation of nanowires or ribbons), followed by deposition of the gate dielectric 121b and then the gate electrode 121a, as best shown in FIGS. 9b-c. In such cases, the gate structure can be, for example, a double-gate, a tri-gate, or gate-all-around. The example channel region shown second from left of FIG. 9a includes three liberated nanoribbons, each having a gate-all-around configuration. The other three example channel regions are fins, each having a tri-gate configuration. Once the final gate structure 121 is formed and planarized, it is recessed, gate cap 123 is deposited (e.g., CVD) and the structure is planarized down to dielectric 120 via a CMP process, as best shown in FIG. 9c. Gate cap 123 protects the final gate structure during subsequent processing, and can be any number of materials, such as silicon nitride. The dimensions of the final gate structure 121 can vary from one embodiment to the next, as will be appreciated. In some example cases, the distance d1 from the top of a given fin (or top nanowire or ribbon) to the top of the final gate structure 121 is in the range of 5 to 30 nm (e.g., 10 to 20 nm), and the distance d2 from the top of a given fin (or top nanowire or ribbon) to the bottom of the final gate structure 121 is in the range of 25 to 100 nm (e.g., 40 to 55 nm, or 48 nm). The width of the final gate structure 121 between the gate spacer 113c will also vary, depending on factors such as desired channel length and/or fin thickness (for non-planar transistors), but in some cases is in the range of 5 to 35 nm (e.g., 8 to 15 nm, or 12 nm). The thickness of gate cap 123 may be, for example, in the range of 1 to 25 nm (e.g., 7 to 25 nm, or 16 nm). The gate dielectric 121b may have a thickness in the range of, for example, one or more monolayers to 10 nm. The gate spacers 113c, when present, can be conformally deposited and have any desired thickness, such as in the range of 5 to 40 nm (e.g., 5 to 15 nm).

The gate dielectric 121b may include any suitable dielectric (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, the gate dielectric 121b may include one or more silicates (e.g., titanium silicate, tungsten silicate, niobium silicate, and silicates of other transition metals). In some embodiments, an annealing process may be carried out on gate dielectric 121b to improve its quality when high-k dielectric material is used. The gate electrode 121a may include a wide range of materials, such as various suitable metals or metal alloys, such as aluminum, tungsten, titanium, tantalum, copper, and carbides and nitrides thereof, for example. In some embodiments, gate dielectric 121b and/or gate electrode 121a may include a multilayer structure of two or more material layers, for example. For instance, in one embodiment, the gate dielectric includes a first layer of silicon dioxide on the channel region, and a second layer of hafnium oxide on the first layer. The gate electrode 121a may include, for instance, a metal plug along with one or more workfunction layers, resistance-reducing layers, and/or barrier layers. In some embodiments, gate dielectric 121b and/or gate electrode 121a may include grading (e.g., increasing and/or decreasing) the content/concentration of one or more materials in at least a portion of the feature(s). Note that although gate dielectric 121b is only shown below gate electrode 121a in FIG. 9b, the gate dielectric 121b may also be present on one or both sides of gate electrode 121a, such that the gate dielectric 121b is u-shaped (in a cross-sectional profile) and between gate electrode 121a and the gate spacer 113c, as shown in FIG. 9c. Numerous gate structure configurations will be apparent in light of this disclosure.

Figure 10:
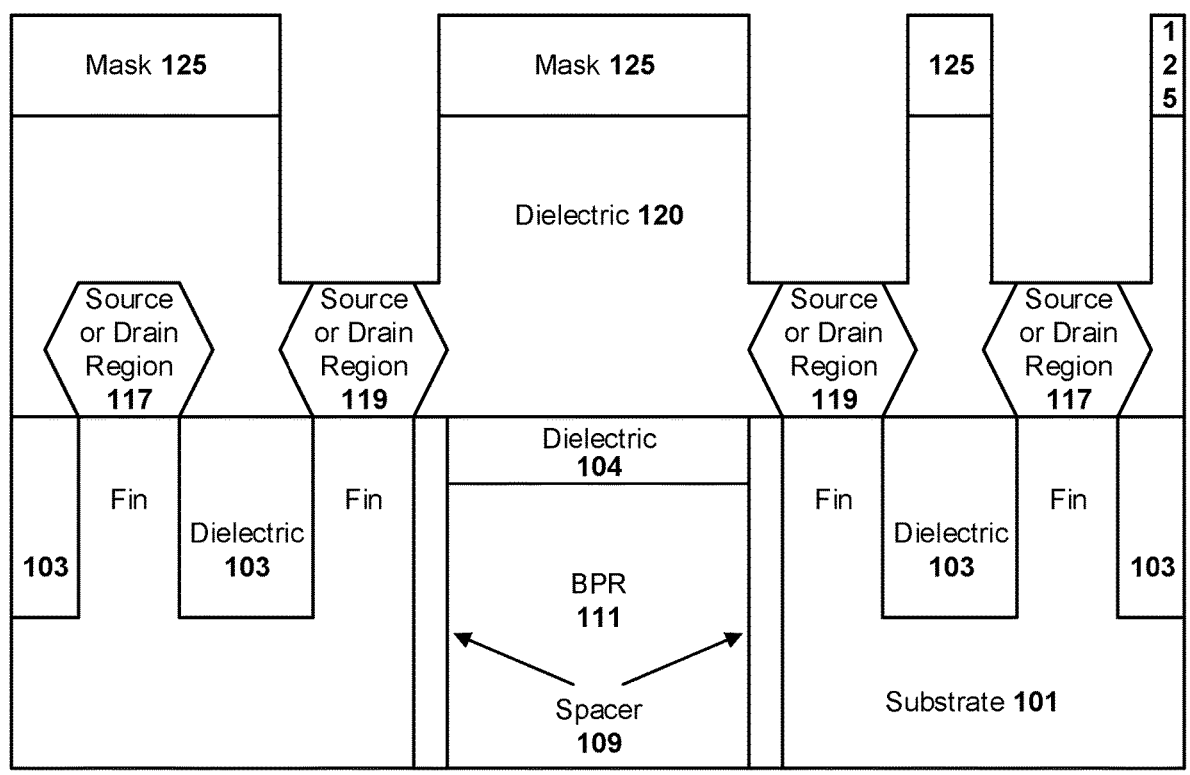

FIG. 10 is the cross-sectional view of the structure depicted in FIGS. 9a-c, after a mask 125 is patterned and contact trenches are etched over one or more of the source or drain regions 117 and 119, according to an embodiment. As can be seen, the cross-section is taken parallel to the final gate structure 121, but through the source or drain regions. The mask 125 can be any suitable mask such as, for instance, photoresist or one or more layers (e.g., carbon hard mask). Note that the mask 125 may be open over the gate structure 121, as the etch is selective to the nitride-based materials of the gate cap 123 and gate spacer 113c, and thus only etches the oxide of dielectric 120, according to an embodiment. In this sense, the contact trenches are self-aligned to the gate structure 121. Any wet or dry etch schemes selective to the gate cap 123 and gate spacer 113c and capable of removing dielectric 120 can be used. In this example case, note that the source or drain region 117 on the far left is masked over and therefore not to be contacted.

Figure 11:
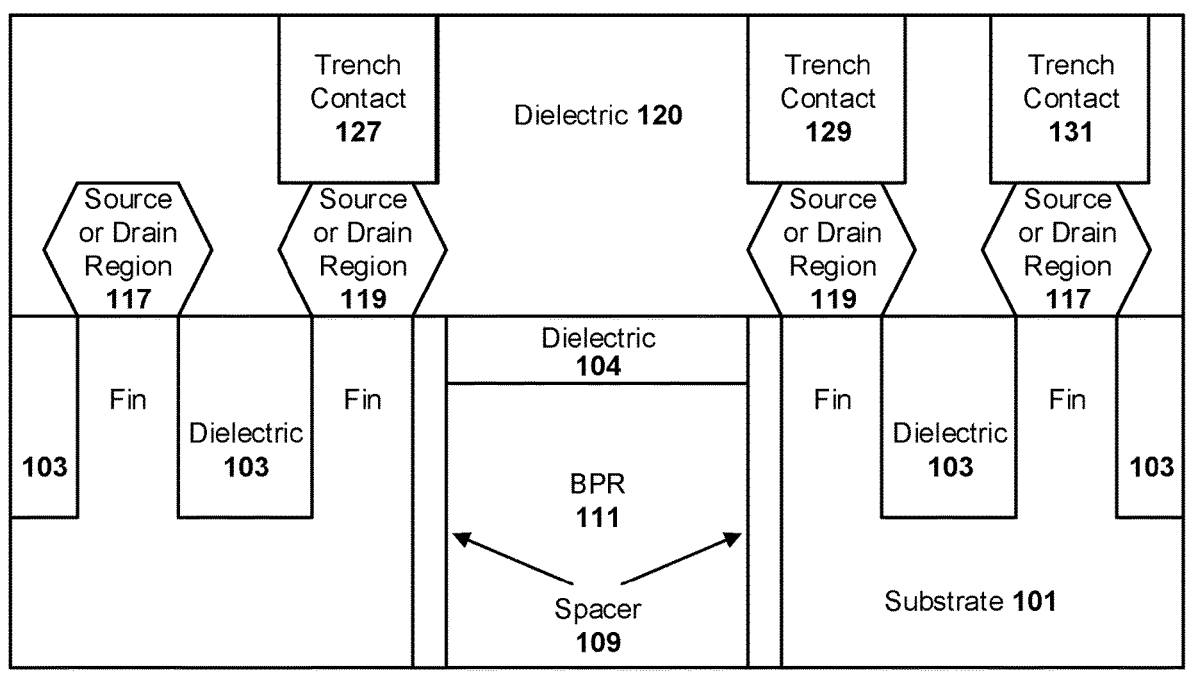

FIG. 11 is the cross-sectional view of the structure depicted in FIG. 10, after trench contacts 127, 129, and 131 are filled and planarized, according to an embodiment. In some embodiments, a selective liner deposition (e.g., titanium silicide, titanium nitride, or tantalum nitride) is provided first, followed by a metal fill (e.g., tungsten, molybdenum, cobalt, ruthenium, or alloys thereof). For instance, a liner of titanium silicide can first be deposited on the exposed source/drain regions 117 and 119, followed by a deposition of ruthenium or ruthenium alloy to fill the contact trench. Any suitable deposition techniques can be used, such as CVD or ALD, as will be appreciated. The planarization can be done, for example, with CMP over-polish and a RIE clear.

Figure 12:
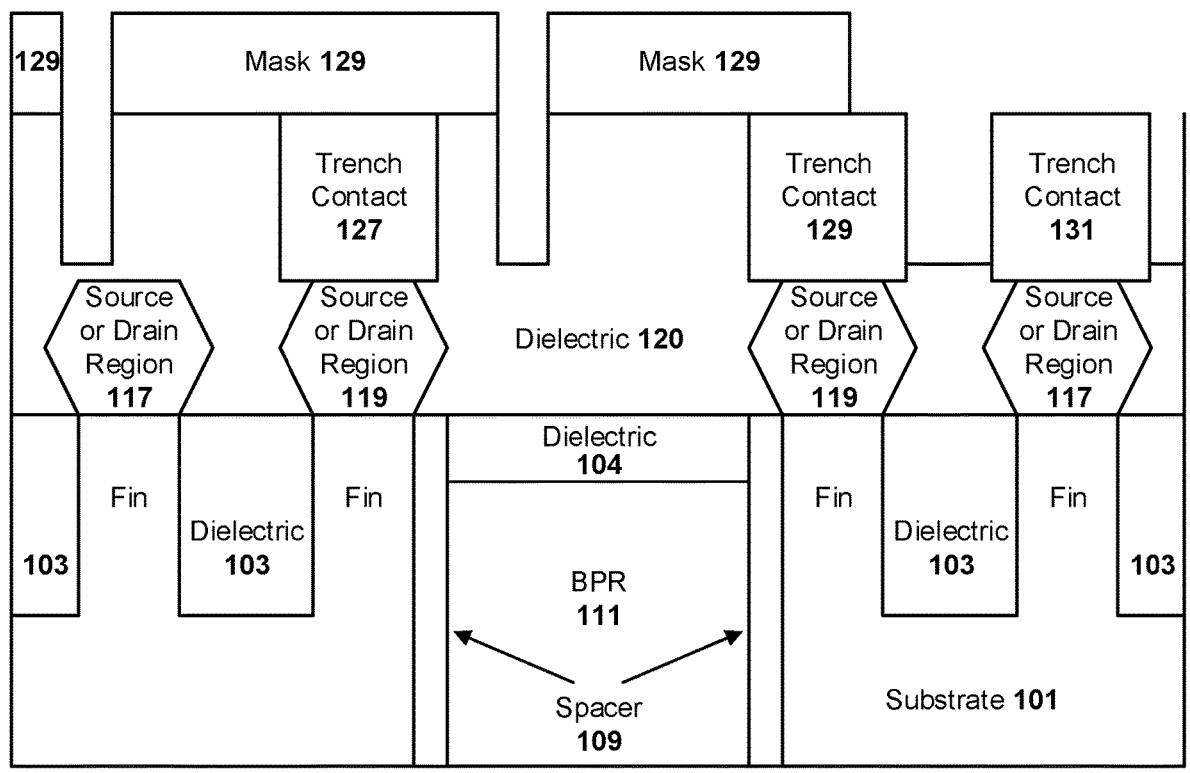

FIG. 12 is the cross-sectional view of the structure depicted in FIGS. 11, after a mask 129 is patterned and insulator trenches are etched at various locations, according to an embodiment. As can be seen, the cross-section is taken parallel to the final gate structure 121, but through the source or drain regions. The mask 129 can be any suitable mask such as, for instance, photoresist or one or more layers (e.g., carbon hard mask). Note that, like mask 125, the mask 129 may be open over the gate structure 121, as the etch is selective to the nitride-based materials of the gate cap 123 and gate spacer 113c, and thus only etches the oxide of dielectric 120, according to an embodiment. In this sense, the insulator trenches are self-aligned to the gate structure 121. The etch is also selective to the metal of trench contacts 127, 129 and 131. In this sense, the insulator trenches are self-aligned to the trench contacts. Again, any wet or dry etch schemes selective to the gate cap 123 and gate spacer 113c and capable of removing dielectric 120 can be used. As will be appreciated in light of this disclosure, these insulator trenches will provide electrical isolation between first and second trench contacts that are not to be electrically coupled.

Figure 13A:
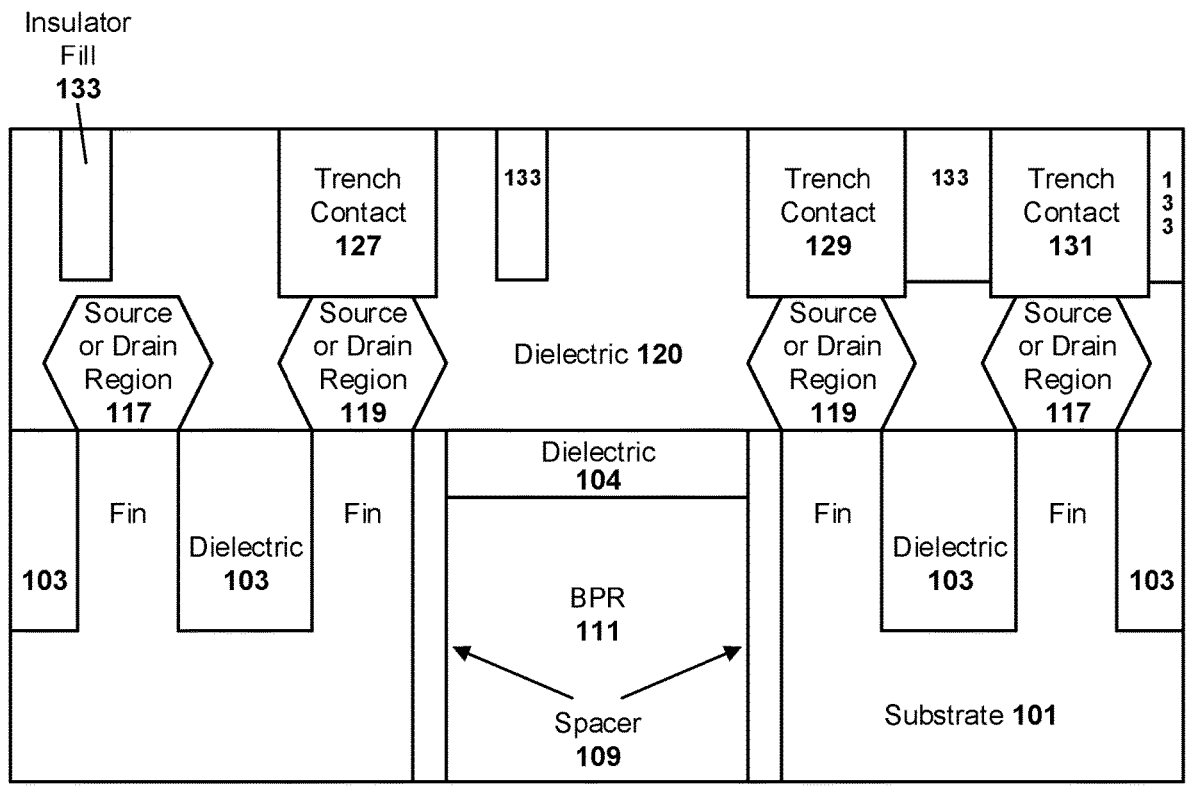
Figure 13B:
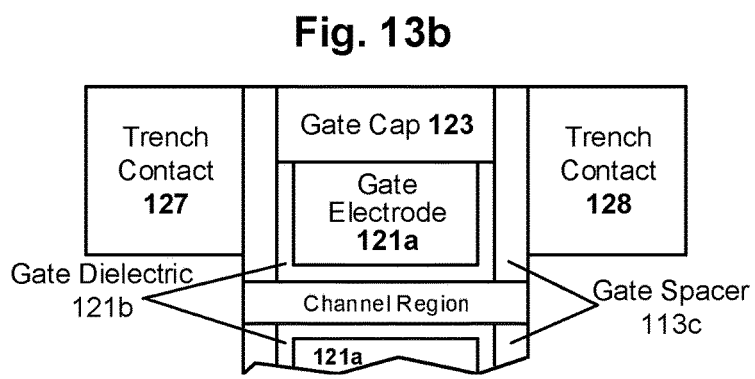

FIG. 13a is the cross-sectional view of the structure depicted in FIG. 12, after insulator fill 133 is deposited and planarized, according to an embodiment. In some embodiments, an insulator deposition (e.g., silicon oxycarbonitride, oxynitride, boron-doped nitride) is used to fill the insulator trenches. For instance, a deposition of silicon oxycarbonitride is used to fill the insulator trenches. Any suitable deposition techniques can be used, such as CVD or ALD, as will be appreciated. The planarization can be done, for example, with CMP. FIG. 13b shows a cross-section taken through the gate structure and channel region and parallel to the fin. Note how the trench contacts 127 and 128 are self-aligned to the gate structure. The underlying source and drain regions are not shown, but would be under the contact trenches and adjacent the channel region, as will be appreciated. Further note in this example that the channel region has been ribbonized, and has a gate-all-around configuration.

Figure 14A:
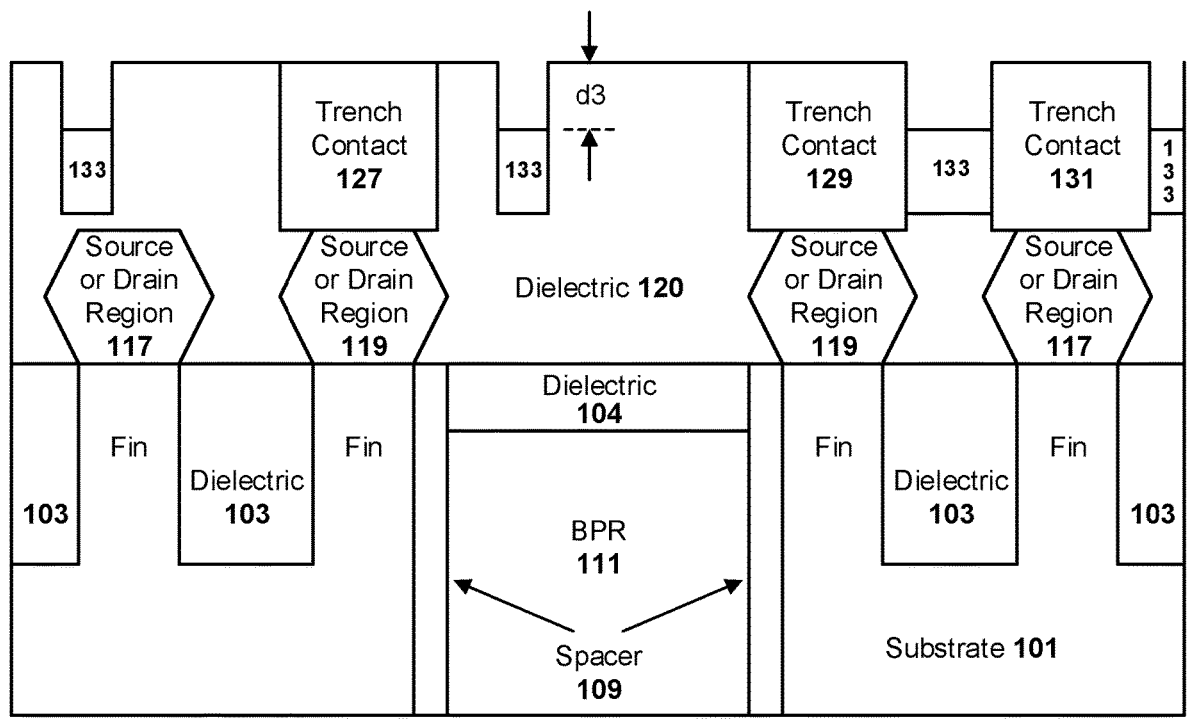
Figure 14B:
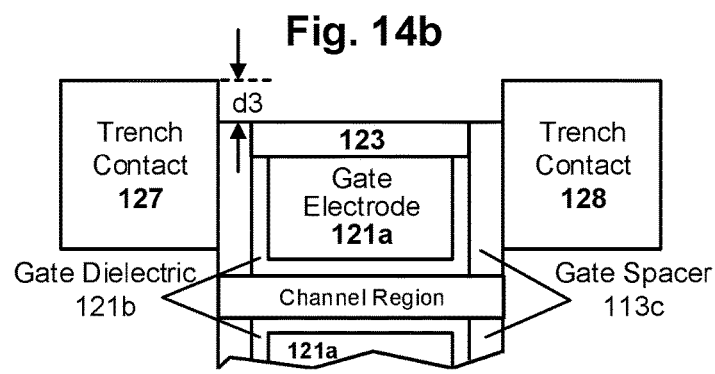

FIG. 14a is the cross-sectional view of the structure depicted in FIG. 13a, after insulator fill 133 is recessed, according to an embodiment. In some embodiments, an isotropic recess etch that is selective to dielectric 120 (e.g., an oxide, such as silicon dioxide) and trench contacts 127-131 (e.g., metals, such as ruthenium) is used to selectively recess the insulator trenches 133 (e.g., oxycarbonitride, such as silicon oxycarbonitride). FIG. 14b shows a cross-section taken through the gate structure and channel region and parallel to the fin. Note how the gate cap 123 (e.g., nitride, such as silicon nitride) and gate spacer 113c (e.g., oxycarbonitride, such as silicon oxycarbonitride) have also been recessed, along with the insulator fill 133.

Further note the depth of the recess is a distance d3, which can be in the range of 10 to 15 nm (e.g., 12 nm), in some embodiments.

Figure 15A:
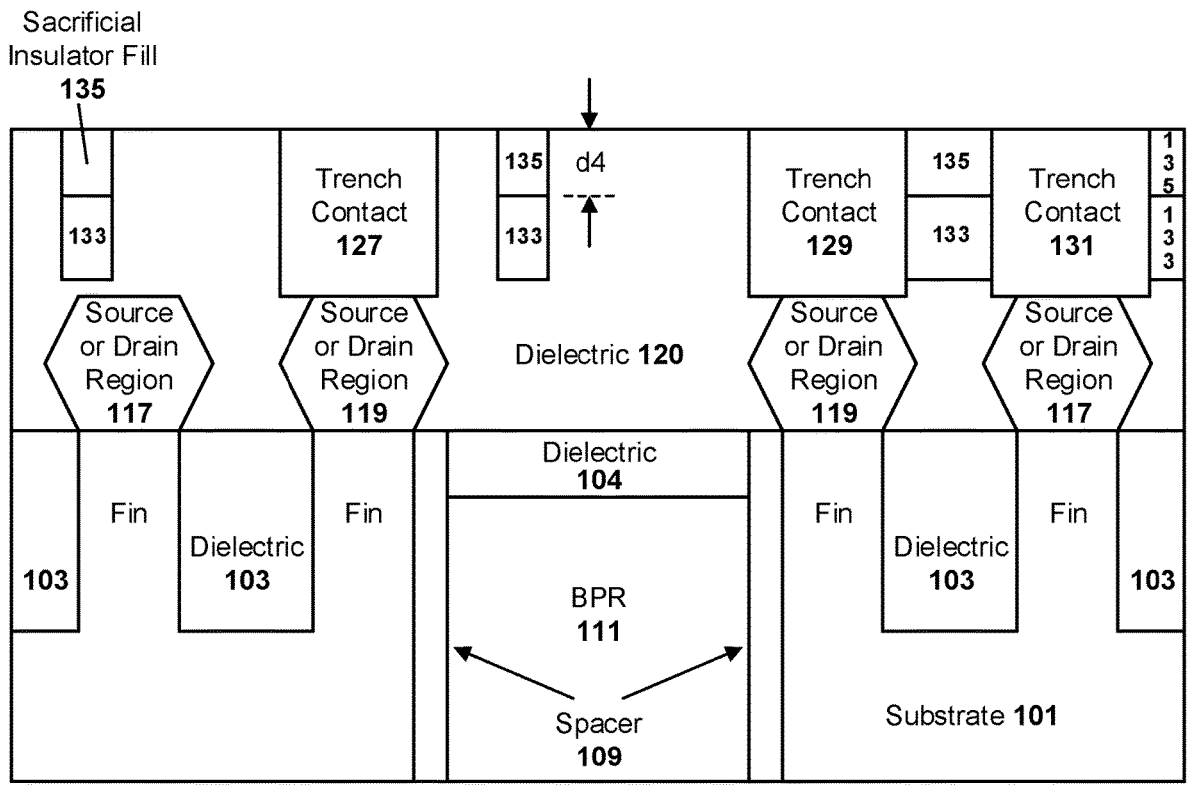
Figure 15B:
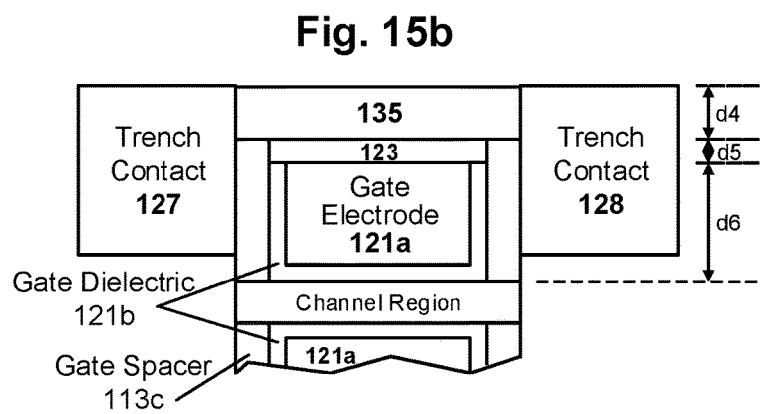
Figure 19A:
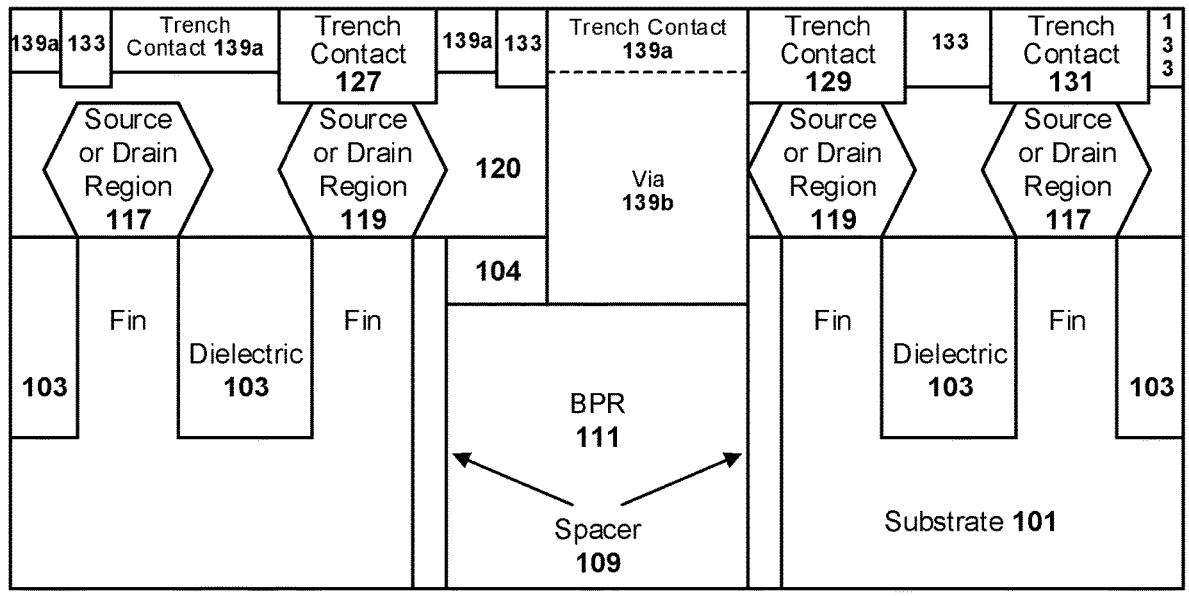
Figure 19B:
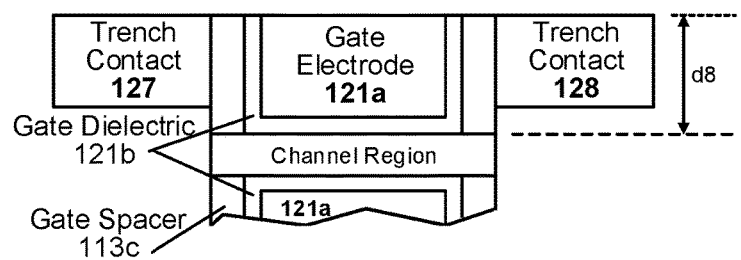

FIG. 15a is the cross-sectional view of the structure depicted in FIG. 14a, after sacrificial insulator fill 135 is deposited and planarized, according to an embodiment. In some embodiments, an insulator deposition (e.g., titanium oxide) is used to fill the recessed insulator trenches. For instance, a deposition of titanium oxide is used to fill the recessed insulator trenches. Any suitable deposition techniques can be used, such as CVD or ALD, as will be appreciated. The planarization can be done, for example, with CMP. FIG. 15b shows a cross-section taken through the gate structure and channel region and parallel to the fin. Note how the sacrificial insulator fill 135 is deposited and planarized over the gate structure and between the corresponding trench contacts of that transistor. Further note the height of the sacrificial insulator fill 135 is a distance d4, which can be in the range of 8 to 13 nm (e.g., 10 nm), in some embodiments. The difference in distance d3 (e.g., 12 nm) and d4 (e.g., 10 nm) is due to height loss caused by CMP, according to an embodiment. The gate cap 123 may have lost some thickness from the various CMP processes, but in some embodiments has a thickness (d5) in the range of 4 to 8 nm (e.g., 5 nm). As can be further seen, the distance d6 from the top of the gate structure 121 to the top of the channel region (which in this example case is a nanoribbon) can be in the range of, for example 10 to 30 nm (e.g., 20 nm), in some embodiments. These distances d4, d5 and d6 provide some CMP budget for subsequent processing, such as when the structure is planarized to reveal the top of gate structure 121, as will be discussed in turn with referenced to FIGS. 19a-b. For instance, and with brief reference to FIG. 19b, assume that distance d8 from the top of the gate structure 121 to the top of the channel region is 15 nm, in an example. Now, referring back to FIG. 15b, further assume for this example that distance d4 is 10 nm, distance d5 is 5 nm, and distance d6 is 20 nm. Such an example case provides a 20 nm CMP budget (in other words, the overall distance from the top of the structure to the top of the channel region as shown in FIGS. 15a-b will decrease by 20 nm by the time the structure in FIGS. 19a-b is formed).

Figure 16:
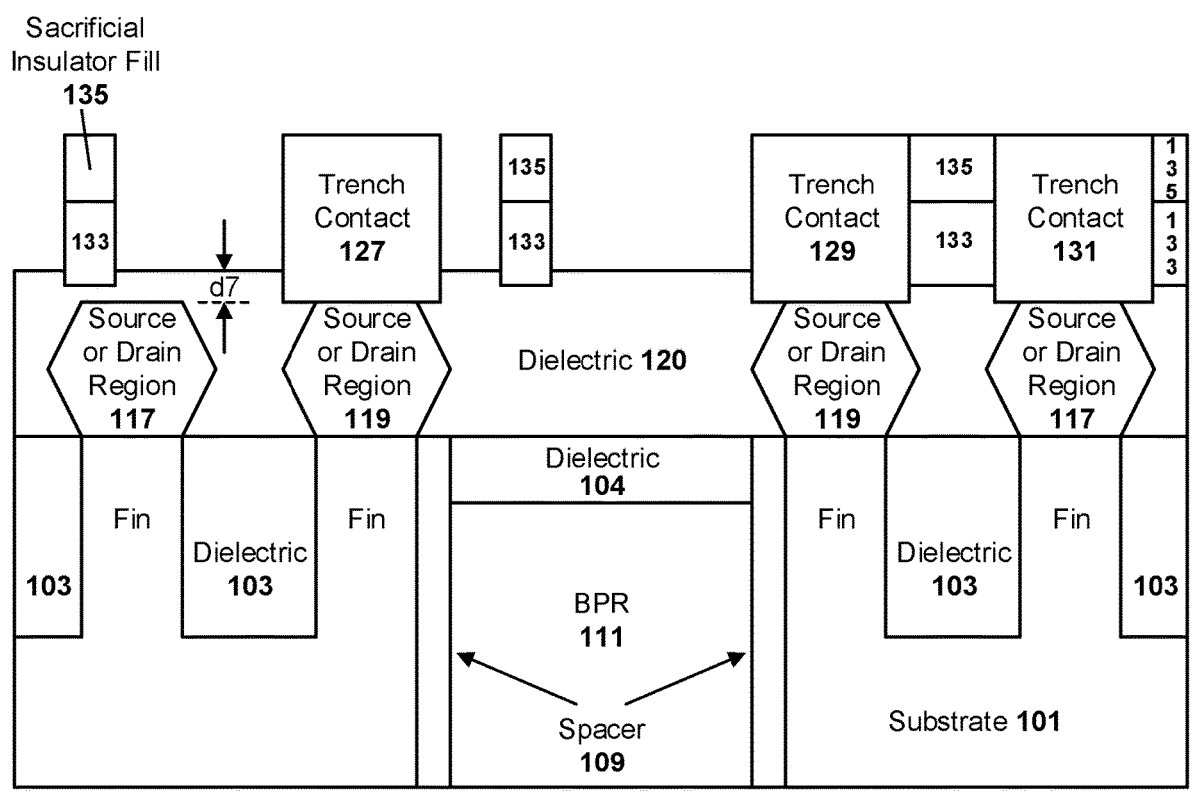

FIG. 16 is the cross-sectional view of the structure depicted in FIG. 15a, after dielectric 120 has been recess, according to an embodiment. As can be seen, the cross-section is taken parallel to the final gate structure 121, but through the source or drain regions. Note that the etch is selective to the gate cap 123 (e.g., titanium nitride) and gate spacer 113c (e.g., silicon oxycarbonitride), as well as sacrificial insulator fill 135 (e.g., titanium oxide) and trench contacts 127-131 (e.g., ruthenium) and thus only etches dielectric 120 (e.g., silicon oxide), according to an embodiment. In this sense, these second contact trenches are self-aligned to the gate structure 121 as well as trench contacts 127-131 and sacrificial insulator fill 135. Any wet or dry etch schemes selective in this manner can be used. Further note that the depth of the recess is such that a distance d7 from the top of the source or drain regions 117 and 119 to the top of the recessed dielectric 120 is in the range of 5 to 15 nm (e.g., 10 nm). It will be appreciated in light of this disclosure that this distance effectively determines the height of the second trench contacts to be formed.

Figure 17:
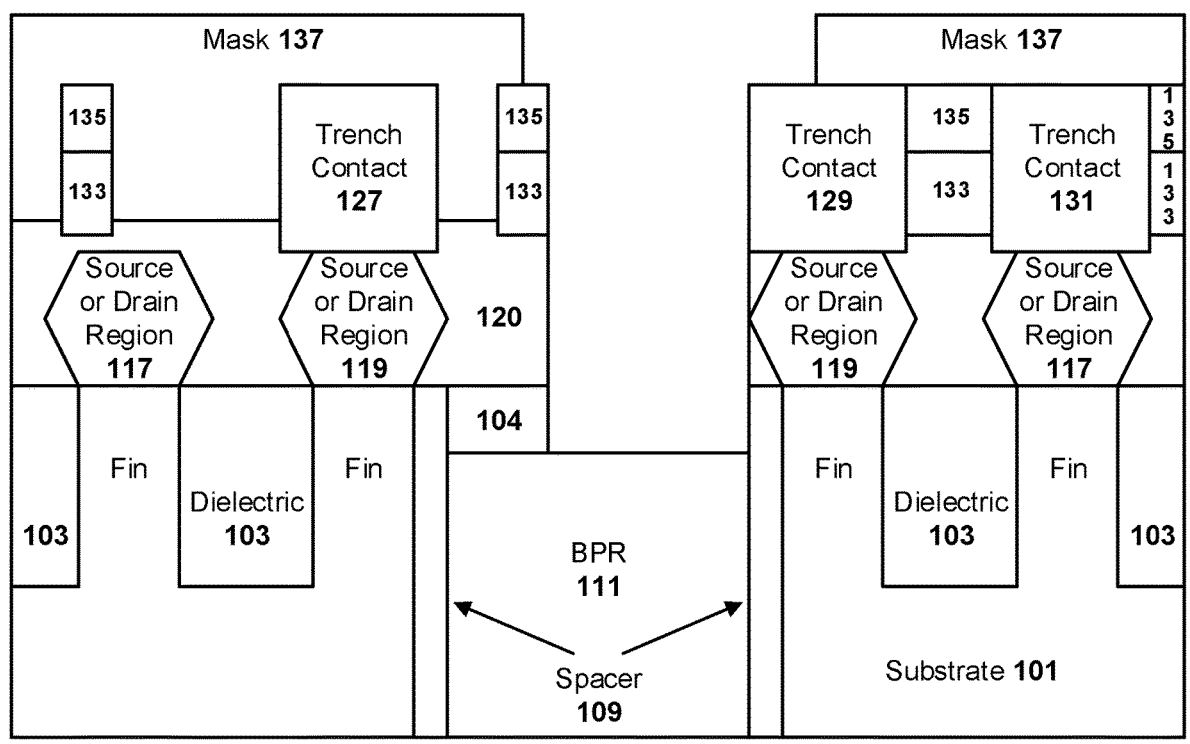

FIG. 17 is the cross-sectional view of the structure depicted in FIGS. 16, after a mask 137 is patterned and via trench is etched over BPR 111, according to an embodiment. As can be seen, the cross-section is taken parallel to the final gate structure 121, but through the source or drain regions. The mask 137 can be any suitable mask such as, for instance, photoresist or one or more layers (e.g., carbon hard mask). Note that the mask 137 may be open over the gate structure 121, as the etch is selective to the gate cap 123 (e.g., silicon nitride) and gate spacer 113c (e.g., silicon oxycarbonitride) as well as the exposed trench contact 129 (e.g., ruthenium) and the exposed sacrificial insulator fill 135 (e.g., nitride or oxide that is more etch resistant than the oxide of dielectrics 120 and 104, such as titanium oxide), and thus only etches dielectrics 120 and 104 (e.g., oxides, such as silicon dioxide), according to an embodiment. In this sense, the via trench is self-aligned to the gate structure 121 as well as the contact being formed. Any anisotropic etch schemes selective in this manner can be used, according to some embodiments.

Figure 18:
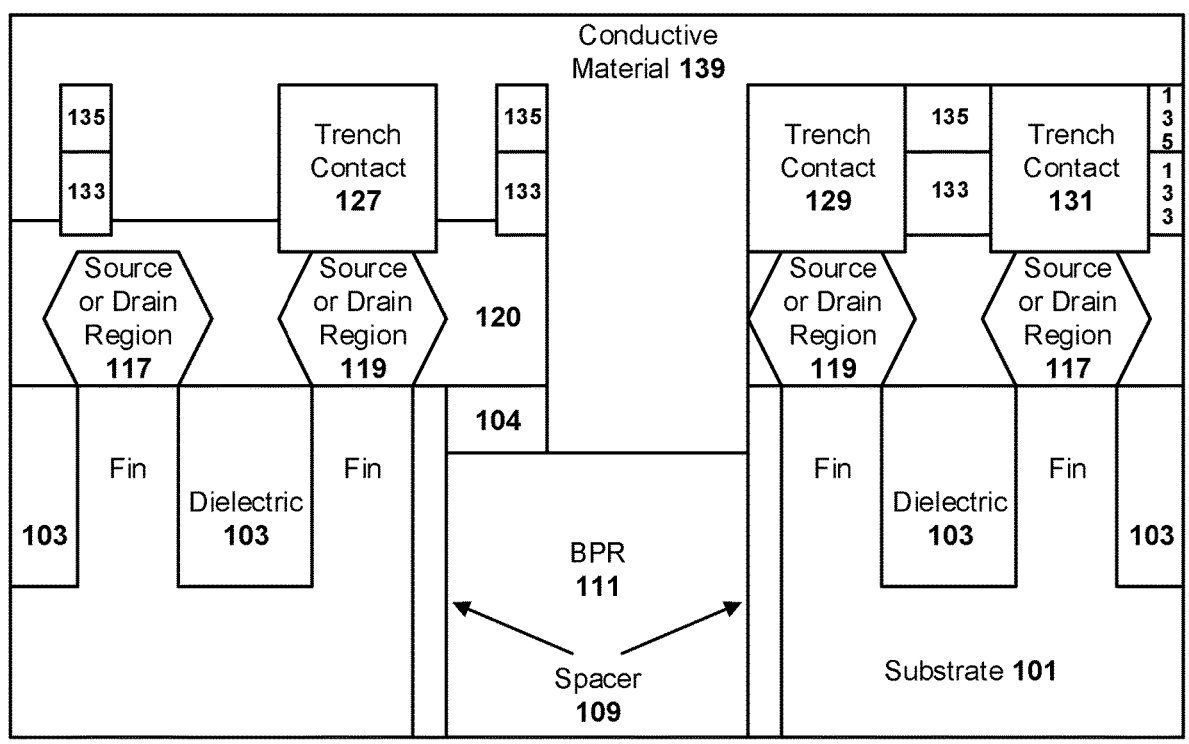

FIG. 18 is the cross-sectional view of the structure depicted in FIG. 17, after mask 137 has been removed and conductive material 139 has been deposited into the second contact trenches and via trench, according to an embodiment. In some embodiments, a thin liner deposition (e.g., 4 to 10 angstroms of titanium, titanium silicide, titanium nitride, or tantalum nitride) is provided first, followed by a metal fill (e.g., tungsten, molybdenum, cobalt, ruthenium, or alloys thereof). For instance, a liner of titanium nitride having a thickness of about 5 angstroms can first be blanket deposited, followed by a deposition of ruthenium or ruthenium alloy to fill the via trench. Any suitable deposition techniques can be used, such as CVD or ALD, as will be appreciated.

FIG. 19a is the cross-sectional view of the structure depicted in FIG. 18, after removal of excess conductive material 139 (e.g., by way of a planarization/polishing technique such as CMP) so as to provide trench contact 139a as well as via 139b, according to an embodiment. Note that the planarization removes the sacrificial insulator fill 135 as well as a top portion of trench contacts 127-131. The result is that the tops of trench contacts 127-131 are co-planar with the top of each portion of trench contact 139a, as well as the tops of insulator fill 133 and the gate structure 121. FIG. 19b shows a cross-section taken through the gate structure and channel region and parallel to the fin. Note how the sacrificial insulator fill 135 and gate cap 123 have been planarized away so that the top surface of the gate structure 121 is co-planar with the top surfaces of the trench contacts 127 and 128 to either side of the gate structure 121. Further note that the distance d8 from the top of the gate structure 121 to the top of the channel region (which in this example case is a nanoribbon) can be in the range of, for example 10 to 20 nm (e.g., 15 nm), in some embodiments.

Recall that trench contacts 127-131 can be implemented with the same material as the non-contiguous portions of trench contact 139a. Because of their separate depositions, there will be an interface between them, when they are laterally adjacent and in contact with one another. This interface is detectable, and may include a grain boundary or set of grain boundaries or liner materials (or barrier materials, as the case may be), as discussed with reference to FIGS. 1a-b. Further note that non-contiguous portions of trench contact 139a may be electrically connected to one another, or not. In some cases, one or more portions (and possibly all portions) of trench contact 139a are electrically insulated from other portions of trench contact 139a. For example, the left two portions of trench contact 139a are electrically insulated from one another by the leftmost insulator fill 133. In some case, one or more portions (and possibly all portions) of trench contact 139a are electrically connected to other portions of trench contact 139a. For example, trench contact 127 electrically connects the left-neighboring portion of trench contact 139a to the right-neighboring portion of trench contact 139a. Numerous such lateral contacting schemes will be appreciated in light of this disclosure.

A number of further observations can be made of the example structure shown. For instance, the sidewall of trench contact 129 is self-aligned to, and interfaces with, a first (right) sidewall of the left-neighboring portion of trench contact 139a, so as to provide an electrical pathway (lateral contact) between those trench contacts. Further note that via 139b extends from that portion of trench contact 139a to the underlying BPR 111. Further note the via 139b is self-aligned to trench contact 129 and its left-neighboring trench contact 139a. Further note that trench contact 139a has a maximum height that is shorter than a maximum height of trench contacts 127-131. For instance, in some embodiments, the maximum height of the second portion of trench contact 139a is 5 to 15 nm (e.g., 8 to 10 nm) shorter than the maximum height of trench contacts 127-131. In addition, a second (left) sidewall of trench contact 139a to the left of trench contact 129 is in contact with insulator material fill 133, and the insulator fill 133 has a maximum height that is shorter than the maximum height of trench contacts 127-131, but greater than the maximum height of trench contact 139a, in this example case. Further note that the farthest left portion of trench contact 139a extends laterally between, and interface with, an insulator fill 133 (to the left) and trench contact 127 (to the right), and at least partially extends over the underlying source or drain region 117, without contacting that source or drain region 117.

FURTHER EXAMPLE EMBODIMENTS

Example 1 is an integrated circuit, comprising: a gate structure having a top surface; a first source or drain region; a second source or drain region; a first trench contact on the first source or drain region, the first trench contact having a top surface and a sidewall; a second trench contact that includes non-contiguous first and second portions, each portion having a top surface that is co-planar with the top surface of the first trench contact as well as the top surface of the gate structure, wherein a sidewall of the first portion of the second trench contact is in contact with the sidewall of the first trench contact so as to provide an interface therebetween, and wherein the second portion of the second trench contact extends over a second source or drain region, with no contact to the second source or drain region; and a via that extends from the first portion of the second trench contact to an underlying conductor.

Example 2 includes the subject matter of Example 1, wherein first trench contact is taller than the second portion of the second trench contact.

Example 3 includes the subject matter of Example 1 or 2, wherein first trench contact is 5 nanometers to 15 nanometers taller than the second portion of the second trench contact.

Example 4 includes the subject matter of any one of Examples 1 through 3, wherein the sidewall of the first trench contact is a first sidewall, and wherein a sidewall of the second portion of the second trench contact is in contact with a second sidewall of the first trench contact so as to provide an interface therebetween.

Example 5 includes the subject matter of any one of Examples 1 through 4, wherein the interface between the sidewall of the first trench contact and the sidewall of the first portion of the second trench contact includes a liner material. A similar feature may also apply to the interface between the sidewall of the second portion of the second trench contact and the second sidewall of the first trench contact.

Example 6 includes the subject matter of any one of Examples 1 through 5, wherein the interface between the sidewall of the first trench contact and the sidewall of the first portion of the second trench contact includes one or more grain boundaries. A similar feature may also apply to the interface between the sidewall of the second portion of the second trench contact and the second sidewall of the first trench contact.

Example 7 includes the subject matter of any one of Examples 1 through 6, wherein the sidewall of the first portion of the second trench contact is a first sidewall of the first portion of the second trench contact, the first portion of the second trench contact having a second sidewall that is in contact with an insulator material, the insulator material having a top surface that is co-planar with the top surface of the first portion of the second trench contact.

Example 8 includes the subject matter of Example 7, wherein the insulator material has a maximum height that extends from the top surface of the insulator material to a bottom surface of the insulator material, the maximum height of the insulator material being shorter than the maximum height of the first trench contact.

Example 9 includes the subject matter of any one of Examples 1 through 8, wherein the source or drain region is a first source or drain region, the integrated circuit including: a third source or drain region; and a third trench contact on the third source or drain region, the third trench contact having a top surface that is co-planar with the top surface of the first trench contact, wherein the third trench contact is between the first and second portions of the second trench contact.

Example 10 includes the subject matter of any one of Examples 1 through 9, wherein the first portion of the second trench contact has the same maximum height as the second portion of the second trench, not counting the via.

Example 11 includes the subject matter of any one of Examples 1 through 10, wherein the underlying conductor is a buried power rail or a backside power rail.

Example 12 is a microprocessor comprising the integrated circuit of any one of Examples 1 through 11.

Example 13 is a memory comprising the integrated circuit of any one of Examples 1 through 11. In some such cases, the memory is within the microprocessor of Example 12.

Example 14 is an integrated circuit, comprising: a gate structure having a top surface; a source or drain region; a first trench contact on the source or drain region, the first trench contact having first and second sidewalls that extend between a top surface of the first trench contact and a bottom surface of the first trench contact, the first trench contact having a maximum height that extends from the top surface of the first trench contact to the bottom surface of the first trench contact; a second trench contact that includes non-contiguous first and second portions, each portion having a top surface that is co-planar with the top surface of the first trench contact as well as the top surface of the gate structure, wherein a sidewall of the first portion of the second trench contact is in contact with the first sidewall of the first trench contact so as to provide an interface therebetween, and wherein at least the second portion of the second trench contact has a maximum height that extends from the top surface of the second portion to a bottom surface of the second portion, the maximum height of the second portion of the second trench being shorter than the maximum height of the first trench contact; and a via that extends from the first portion of the second trench contact to an underlying conductor.

Example 15 includes the subject matter of Example 14, wherein the source or drain region is a first source or drain region, and wherein the second portion of the second trench contact extends over a second source or drain region, with no contact to the second source or drain region.

Example 16 includes the subject matter of Example 14 or 15, wherein a sidewall of the second portion of the second trench contact is in contact with the second sidewall of the first trench contact so as to provide an interface therebetween.

Example 17 includes the subject matter of any one of Examples 14 through 16, wherein the interface between the first sidewall of the first trench contact and the sidewall of the first portion of the second trench contact includes a liner material. A similar feature may also apply to the interface between the second portion of the second trench contact and the first trench contact.

Example 18 includes the subject matter of any one of Examples 14 through 17, wherein the first and second trench contacts consist of the same material, and the interface between the first sidewall of the first trench contact and the sidewall of the first portion of the second trench contact includes one or more grain boundaries. A similar feature may also apply to the interface between the second portion of the second trench contact and the first trench contact.

Example 19 includes the subject matter of any one of Examples 14 through 18, wherein the sidewall of the first portion of the second trench contact is a first sidewall of the first portion of the second trench contact, the first portion of the second trench contact having a second sidewall that is in contact with an insulator material, the insulator material having a top surface that is co-planar with the top surface of the first portion of the second trench contact.

Example 20 includes the subject matter of Example 19, wherein the insulator material has a maximum height that extends from the top surface of the insulator material to a bottom surface of the insulator material, the maximum height of the insulator material being shorter than the maximum height of the first trench contact.

Example 21 includes the subject matter of any one of Examples 14 through 20, wherein the source or drain region is a first source or drain region, the integrated circuit including: a second source or drain region; and a third trench contact on the second source or drain region, the third trench contact having a top surface that is co-planar with the top surface of the first trench contact, wherein the third trench contact is between the first and second portions of the second trench contact.

Example 22 includes the subject matter of any one of Examples 14 through 21, wherein the first portion of the second trench contact has the same maximum height as the second portion of the second trench, not counting the via.

Example 23 includes the subject matter of any one of Examples 14 through 22, wherein the maximum height of the second portion of the second trench contact is 5 nanometers to 15 nanometers shorter than the maximum height of the first trench contact.

Example 24 includes the subject matter of any one of Examples 14 through 23, wherein the underlying conductor is a buried power rail or a backside power rail.

Example 25 is a processor comprising the integrated circuit any one of Examples 14 through 23.

Example 26 is a memory comprising the integrated circuit any one of Examples 14 through 23. In some examples, the memory is included within the microprocess or Example 25.

Example 27 is an integrated circuit, comprising: a gate structure having a top surface, the gate structure including a gate dielectric, a gate electrode, and a gate spacer; a first source or drain region in contact with semiconductor material under the gate structure; a second source or drain region; a first trench contact on the source or drain region, the first trench contact having first and second sidewalls that extend between a top surface of the first trench contact and a bottom surface of the first trench contact, the first trench contact having a maximum height that extends from the top surface of the first trench contact to the bottom surface of the first trench contact; a second trench contact that includes non-contiguous first and second portions, each portion having a top surface that is co-planar with the top surface of the first trench contact as well as the top surface of the gate structure, wherein a sidewall of the first portion of the second trench contact is in contact with the first sidewall of the first trench contact so as to provide an interface therebetween, and wherein at least the second portion of the second trench contact has a maximum height that extends from the top surface of the second portion to a bottom surface of the second portion, the maximum height of the second portion of the second trench being shorter than the maximum height of the first trench contact, and wherein the second portion of the second trench contact extends over the second source or drain region, with no contact to the second source or drain region; and a via that extends from the first portion of the second trench contact to a buried power rail or a backside power rail.

Example 28 includes the subject matter of Example 27, wherein a sidewall of the second portion of the second trench contact is in contact with the second sidewall of the first trench contact so as to provide an interface therebetween.

Example 29 includes the subject matter of Example 27 or 28, wherein the interface between the first sidewall of the first trench contact and the sidewall of the first portion of the second trench contact includes a liner material and/or one or more grain boundaries. A similar feature may also apply to the interface between the second portion of the second trench contact and the first trench contact.

Example 30 includes the subject matter of any one of Examples 27 through 29, wherein the sidewall of the first portion of the second trench contact is a first sidewall of the first portion of the second trench contact, the first portion of the second trench contact having a second sidewall that is in contact with an insulator material, the insulator material having a top surface that is co-planar with the top surface of the first portion of the second trench contact, and wherein the insulator material has a maximum height that extends from the top surface of the insulator material to a bottom surface of the insulator material, the maximum height of the insulator material being shorter than the maximum height of the first trench contact.

Example 31 includes the subject matter of any one of Examples 27 through 30, wherein the source or drain region is a first source or drain region, the integrated circuit including: a third source or drain region; and a third trench contact on the third source or drain region, the third trench contact having a top surface that is co-planar with the top surface of the first trench contact, wherein the third trench contact is between the first and second portions of the second trench contact.

Example 32 includes the subject matter of any one of Examples 27 through 31, wherein the first portion of the second trench contact has the same maximum height as the second portion of the second trench, not counting the via.

Example 33 includes the subject matter of any one of Examples 27 through 32, wherein the maximum height of the second portion of the second trench contact is 5 nanometers to 15 nanometers shorter than the maximum height of the first trench contact.

Example 34 includes the subject matter of any one of Examples 27 through 33, wherein the underlying conductor is a buried power rail or a backside power rail.

Example 35 is a processor comprising the integrated circuit any one of Examples 27 through 34.

Example 36 is a memory comprising the integrated circuit any one of Examples 27 through 34. In some examples, the memory is included within the microprocess or Example 35.

Example 37 is an integrated circuit, comprising: a first trench contact having a first maximum height; and a second trench contact having a second maximum height and that includes non-contiguous first and second portions, each portion having a top surface that is co-planar with a top surface of the first trench contact, wherein a sidewall of the first portion of the second trench contact is in contact with a sidewall of the first trench contact so as to provide an interface therebetween, and wherein the second portion of the second trench contact extends over a source or drain region, with no contact to that source or drain region, and wherein the second maximum height is shorter than the first maximum height.

Example 38 includes the subject matter of Example 37, and further includes a gate structure having a top surface, wherein the top surface of the gate structure is co-planar with the top surface of the first trench contact as well as the top surface of each of the first and second portions of the second contact.

Example 39 includes the subject matter of Example 37 or 38, and further includes a via that extends from the first portion of the second trench contact to a conductor.

Example 40 includes the subject matter of Example 39, wherein the conductor is a buried power rail or a backside power rail.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit, comprising:
   a gate structure having a top surface;
   a first source or drain region;
   a second source or drain region;
   a first trench contact on the first source or drain region, the first trench contact having a top surface and a sidewall;
   a second trench contact that includes non-contiguous first and second portions, each portion having a top surface that is co-planar with the top surface of the first trench contact as well as the top surface of the gate structure, wherein a sidewall of the first portion of the second trench contact is in contact with the sidewall of the first trench contact so as to provide an interface therebetween, and wherein the second portion of the second trench contact extends over a second source or drain region, with no contact to the second source or drain region; and
   a via that extends from the first portion of the second trench contact to an underlying conductor.

2. The integrated circuit of claim 1, wherein first trench contact is taller than the second portion of the second trench contact.

3. The integrated circuit of claim 1, wherein first trench contact is 5 nanometers to 15 nanometers taller than the second portion of the second trench contact.

4. The integrated circuit of claim 1, wherein the sidewall of the first trench contact is a first sidewall, and wherein a sidewall of the second portion of the second trench contact is in contact with a second sidewall of the first trench contact so as to provide an interface therebetween.

5. The integrated circuit of claim 1, wherein the interface between the sidewall of the first trench contact and the sidewall of the first portion of the second trench contact includes a liner material.

6. The integrated circuit of claim 1, wherein the interface between the sidewall of the first trench contact and the sidewall of the first portion of the second trench contact includes one or more grain boundaries.

7. The integrated circuit of claim 1, wherein the sidewall of the first portion of the second trench contact is a first sidewall of the first portion of the second trench contact, the first portion of the second trench contact having a second sidewall that is in contact with an insulator material, the insulator material having a top surface that is co-planar with the top surface of the first portion of the second trench contact.

8. The integrated circuit of claim 7, wherein the insulator material has a maximum height that extends from the top surface of the insulator material to a bottom surface of the insulator material, the maximum height of the insulator material being shorter than the maximum height of the first trench contact.

9. The integrated circuit of claim 1, wherein the source or drain region is a first source or drain region, the integrated circuit including:
   a third source or drain region; and
   a third trench contact on the third source or drain region, the third trench contact having a top surface that is co-planar with the top surface of the first trench contact, wherein the third trench contact is between the first and second portions of the second trench contact.

10. The integrated circuit of claim 1, wherein the underlying conductor is a buried power rail or a backside power rail.

11. An integrated circuit, comprising:
    a gate structure having a top surface;
    a source or drain region;
    a first trench contact on the source or drain region, the first trench contact having first and second sidewalls that extend between a top surface of the first trench contact and a bottom surface of the first trench contact, the first trench contact having a maximum height that extends from the top surface of the first trench contact to the bottom surface of the first trench contact;
    a second trench contact that includes non-contiguous first and second portions, each portion having a top surface that is co-planar with the top surface of the first trench contact as well as the top surface of the gate structure, wherein a sidewall of the first portion of the second trench contact is in contact with the first sidewall of the first trench contact so as to provide an interface therebetween, and wherein at least the second portion of the second trench contact has a maximum height that extends from the top surface of the second portion to a bottom surface of the second portion, the maximum height of the second portion of the second trench being shorter than the maximum height of the first trench contact; and
    a via that extends from the first portion of the second trench contact to an underlying conductor.

12. The integrated circuit of claim 11, wherein the source or drain region is a first source or drain region, and wherein the second portion of the second trench contact extends over a second source or drain region, with no contact to the second source or drain region.

13. The integrated circuit of claim 12, wherein a sidewall of the second portion of the second trench contact is in contact with the second sidewall of the first trench contact so as to provide an interface therebetween.

14. The integrated circuit of claim 11, wherein the interface between the first sidewall of the first trench contact and the sidewall of the first portion of the second trench contact includes a liner material.

15. The integrated circuit of claim 11, wherein the first and second trench contacts consist of the same material, and the interface between the first sidewall of the first trench contact and the sidewall of the first portion of the second trench contact includes one or more grain boundaries.

16. The integrated circuit of claim 11, wherein the sidewall of the first portion of the second trench contact is a first sidewall of the first portion of the second trench contact, the first portion of the second trench contact having a second sidewall that is in contact with an insulator material, the insulator material having a top surface that is co-planar with the top surface of the first portion of the second trench contact, wherein the insulator material has a maximum height that extends from the top surface of the insulator material to a bottom surface of the insulator material, the maximum height of the insulator material being shorter than the maximum height of the first trench contact.

17. An integrated circuit, comprising:
a first trench contact having a first maximum height; and
a second trench contact having a second maximum height and that includes non-contiguous first and second portions, each portion having a top surface that is co-planar with a top surface of the first trench contact, wherein a sidewall of the first portion of the second trench contact is in contact with a sidewall of the first trench contact so as to provide an interface therebetween, and wherein the second portion of the second trench contact extends over a source or drain region, with no contact to that source or drain region, and wherein the second maximum height is shorter than the first maximum height.

18. The integrated circuit of claim 17, further including a gate structure having a top surface, wherein the top surface of the gate structure is co-planar with the top surface of the first trench contact as well as the top surface of each of the first and second portions of the second contact.

19. The integrated circuit of claim 17, further including a via that extends from the first portion of the second trench contact to a conductor.

20. The integrated circuit of claim 19, wherein the conductor is a buried power rail or a backside power rail.

* * * * *